(12) United States Patent
Teig et al.

(10) Patent No.: US 6,889,371 B1
(45) Date of Patent: May 3, 2005

(54) METHOD AND APPARATUS FOR PROPAGATING A FUNCTION

(75) Inventors: Steven Teig, Menlo Park, CA (US); Andrew Caldwell, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 274 days.

(21) Appl. No.: 10/335,062

(22) Filed: Dec. 31, 2002

Related U.S. Application Data

(63) Continuation-in-part of application No. 10/215,923, filed on Aug. 9, 2002, which is a continuation-in-part of application No. 10/215,896, filed on Aug. 9, 2002, which is a continuation-in-part of application No. 10/215,563, filed on Aug. 9, 2002.

(60) Provisional application No. 60/396,571, filed on Jul. 15, 2002, provisional application No. 60/388,518, filed on Jun. 12, 2002, and provisional application No. 60/385,975, filed on Jun. 4, 2002.

(51) Int. Cl.[7] .............................................. G06F 17/50
(52) U.S. Cl. ............................................ 716/12; 716/2
(58) Field of Search ........................ 716/1, 2, 4, 12–14, 716/18

(56) References Cited

U.S. PATENT DOCUMENTS

| | | | |
|---|---|---|---|
| 4,777,606 A | 10/1988 | Fournier | |
| 4,964,056 A | * 10/1990 | Bekki et al. ................... | 716/1 |
| 5,224,057 A | 6/1993 | Igarashi et al. | |
| 5,578,840 A | 11/1996 | Scepanovic et al. | |
| 5,657,272 A | 8/1997 | Sato | |
| 5,663,891 A | 9/1997 | Bamji et al. | |
| 5,717,600 A | 2/1998 | Ishizuka | |
| 5,757,089 A | 5/1998 | Ishizuka | |
| 5,757,656 A | 5/1998 | Hershberger et al. | |
| 5,811,863 A | 9/1998 | Rostoker et al. | |
| 5,822,214 A | 10/1998 | Rostoker et al. | |
| 5,838,583 A | 11/1998 | Varadarajan et al. | |
| 5,856,927 A | 1/1999 | Greidinger et al. | |
| 5,877,091 A | 3/1999 | Kawakami | |
| 5,880,969 A | 3/1999 | Hama et al. | |

(Continued)

FOREIGN PATENT DOCUMENTS

| | | |
|---|---|---|
| JP | 02-262354 | 10/1990 |
| JP | 11-296560 | 10/1999 |

OTHER PUBLICATIONS

Cho J.D., Wiring Space and Length Estimation in Two–Dimensional Arrays, May 2000, Computer–Aided Design of Integrated Circuits and Systems, IEEE Transactions on, vol. 19, Iss. 5, pp. 612–615.

Cong J. et al., DUNE—A Multilayer Gridless Routing System, May 2001, IEEE Transactions on Computer–Aided Design of Integrated Circuits and Systems, vol. 20, iss. 5, pp. 633–647.

(Continued)

*Primary Examiner*—Leigh M. Garbowski
(74) *Attorney, Agent, or Firm*—Stattler, Johansen & Adeli, LLP

(57) ABSTRACT

Some embodiments provide a method of propagating a first function, which is defined over a first state, to a second state in a multi-state space. The method identifies vectors to project from at least some points on the first state that serve as locations of inflection points in the first function; where the vectors are identified based on a model that allows penalizes measurements in certain directions more than other directions. Based on the projected vectors, the method then computes the second function from the first function.

2 Claims, 17 Drawing Sheets

U.S. PATENT DOCUMENTS

| | | | |
|---|---|---|---|
| 5,889,329 | A | 3/1999 | Rostoker et al. |
| 5,889,677 | A | 3/1999 | Yasuda et al. |
| 5,898,597 | A | 4/1999 | Scepanovic et al. |
| 5,973,376 | A | 10/1999 | Rostoker et al. |
| 5,980,093 | A | 11/1999 | Jones et al. |
| 6,006,024 | A | 12/1999 | Guruswamy et al. |
| 6,067,409 | A | 5/2000 | Scepanovic et al. |
| 6,110,222 | A | 8/2000 | Minami et al. |
| 6,128,767 | A | 10/2000 | Chapman |
| 6,154,873 | A | 11/2000 | Takahashi |
| 6,154,874 | A | 11/2000 | Scepanovic et al. |
| 6,175,950 | B1 | 1/2001 | Scepanovic et al. |
| 6,209,123 | B1 | 3/2001 | Maziasz et al. |
| 6,219,823 | B1 | 4/2001 | Hama et al. |
| 6,226,560 | B1 | 5/2001 | Hama et al. |
| 6,230,306 | B1 | 5/2001 | Raspopovic et al. |
| 6,247,167 | B1 | 6/2001 | Raspopovic et al. |
| 6,247,853 | B1 | 6/2001 | Papadopoulou et al. |
| 6,253,363 | B1 | 6/2001 | Gasanov et al. |
| 6,262,487 | B1 | 7/2001 | Igarashi et al. |
| 6,286,128 | B1 | 9/2001 | Pileggi et al. |
| 6,289,495 | B1 | 9/2001 | Raspopovic et al. |
| 6,292,929 | B2 | 9/2001 | Scepanovic et al. |
| 6,324,674 | B2 | 11/2001 | Andreev et al. |
| 6,324,675 | B1 | 11/2001 | Dutta et al. |
| 6,327,693 | B1 | 12/2001 | Cheng et al. |
| 6,327,694 | B1 | 12/2001 | Kanazawa |
| 6,330,707 | B1 | 12/2001 | Shinomiya et al. |
| 6,349,403 | B1 | 2/2002 | Dutta et al. |
| 6,407,434 | B1 | 6/2002 | Rostoker et al. |
| 6,412,102 | B1 | 6/2002 | Andreev et al. |
| 6,415,427 | B2 | 7/2002 | Nitta et al. |
| 6,434,730 | B1 | 8/2002 | Ito et al. |
| 6,436,804 | B2 | 8/2002 | Igarashi et al. |
| 6,442,745 | B1 | 8/2002 | Arunachalam et al. |
| 6,490,713 | B2 | 12/2002 | Matsumoto |
| 6,505,331 | B1 | 1/2003 | Bracha et al. |
| 6,601,227 | B1 | 7/2003 | Trimberger |
| 6,609,237 | B1 | 8/2003 | Hamawaki et al. |
| 6,645,842 | B2 | 11/2003 | Igarashi et al. |
| 6,656,644 | B2 | 12/2003 | Hasegawa et al. |
| 6,665,852 | B2 | 12/2003 | Xing et al. |
| 2001/0003843 | A1 | 6/2001 | Scepanovic et al. |
| 2001/0038612 | A1 | 11/2001 | Vaughn et al. |
| 2002/0043988 | A1 | 4/2002 | Or-Bach et al. |
| 2002/0100009 | A1 | 7/2002 | Xing et al. |
| 2002/0104061 | A1 | 8/2002 | Xing et al. |
| 2002/0107711 | A1 | 8/2002 | Xing et al. |
| 2002/0182844 | A1 | 12/2002 | Igarashi et al. |
| 2003/0005399 | A1 | 1/2003 | Igarashi et al. |
| 2003/0009737 | A1 | 1/2003 | Xing |
| 2003/0014725 | A1 | 1/2003 | Sato et al. |
| 2003/0025205 | A1 | 2/2003 | Shively |
| 2003/0121017 | A1 | 6/2003 | Andreev et al. |
| 2003/0188281 | A1 | 10/2003 | Xing |
| 2004/0044979 | A1 | 3/2004 | Aji et al. |
| 2004/0088670 | A1 | 5/2004 | Stevens et al. |

OTHER PUBLICATIONS

Dion J. et al., Contour: A Tile–based Gridless Router, Mar. 1995, Digital Western Research Laboratory, research Report 95–3, pp. 1–22.

Schulz U., Hiearchical Physical Design System, CompEuro '89, VLSI and Computer Peripherals. VSLI and Microelectronic Applications in Intelligent Peripherals and their Interconnection Networks. Proceedings, May 8–12, 1989, pp. 5/20–5/24.

Tseng H–P. et al., A Gridless Multilayer Router for Standard Cell Circuits Using CTM Cells, Oct. 1999, IEEE Transactions on Computer–Aided Design of Integrated Circuits and Systems, vol. 18, iss. 10, pp. 1462–1479.

U.S. Appl. No. 10/228,736, filed Aug. 26, 2002, Steven Teig, Continuation of U.S. Appl. No. 10/215,563.

U.S. Appl. No. 10/229,311, filed Aug. 26, 2002, Steven Teig, Continuation of U.S. Appl. No. 10/215,563.

U.S. Appl. No. 10/229,108, filed Aug. 26, 2002, Steven Teig, Continuation of U.S. Appl. No. 10/215,563.

U.S. Appl. No. 10/215,563, filed Aug. 9, 2002, Steven Teig, The present application is a CIP of this application.

U.S. Appl. No. 10/215,896, filed Aug. 9, 2002, Steven Teig, The present application is a CIP of this application.

U.S. Appl. No. 10/219,675, filed Aug. 14, 2002, Steven Teig, Continuation of U.S. Appl. No. 10/215,896.

U.S. Appl. No. 10/219,608, filed Aug. 14, 2002, Steven Teig, Continuation of U.S. Appl. No. 10/215,896.

U.S. Appl. No. 10/233,202, filed Aug. 28, 2002, Steven Teig, Continuation of U.S. Appl. No. 10/215,896.

U.S. Appl. No. 10/229,196, filed Aug. 26, 2002, Steven Teig, Continuation of U.S. Appl. No. 10/215,563.

U.S. Appl. No. 10/288,870, filed Nov. 6, 2002, Steven Teig, Continuation of U.S. Appl. No. 10/076,121.

U.S. Appl. No. 10/219,923, filed Aug. 14, 2002, Steven Teig, Continuation of U.S. Appl. No. 10/215,896.

U.S. Appl. No. 10/286,254, filed Aug. 31, 2002, Steven Teig, Continuation of U.S. Appl. No. 10/215,896.

U.S. Appl. No. 10/219,706, filed Aug. 14, 2002, Steven Teig, Continuation of U.S. Appl. No. 10/215,896.

U.S. Appl. No. 10/231,423, filed Aug. 28, 2002, Steven Teig, Continuation of U.S. Appl. No. 10/215,896.

U.S. Appl. No. 10/230,503, filed Aug. 28, 2002, Steven Teig, Continuation of U.S. Appl. No. 10/215,896.

U.S. Appl. No. 10/222,088, filed Aug. 14, 2002, Steven Teig, Continuation of U.S Appl. No. 10/215,896.

U.S. Appl. No. 10/228,679, filed Aug. 26, 2002, Steven Teig, Continuation of U.S. Appl. No. 10/215,563.

U.S. Appl. No. 10/229,202, filed Aug. 26, 2002, Steven Teig, Continuation of U.S. Appl. No. 10/215,563.

U.S. Appl. No. 10/229,170, filed Aug. 26, 2002, Steven Teig, Continuation of U.S. Appl. No. 10/215,563.

U.S. Appl. No. 10/286,630, filed Oct. 31, 2002, Steven Teig, Continuation of U.S. Appl. No. 10/215,563.

U.S. Appl. No. 10/230,504, filed Aug. 28, 2002, Steven Teig, Continuation of U.S. Appl. No. 10/215,563.

U.S. Appl. No. 10/215,923, filed Aug. 9, 2002, Steven Teig, The present application is a CIP of this application.

U.S. Appl. No. 10/226,483, filed Aug. 23, 2002, Steven Teig, Continuation of U.S. Appl. No. 10/215,923.

U.S. Appl. No. 10/226,774, filed Aug. 23, 2002, Steven Teig, Continuation of U.S. Appl. No. 10/215,923.

U.S. Appl. No. 10/232,795, filed Aug. 28, 2002, Steven Teig, Continuation of U.S. Appl. No. 10/215,923.

U.S. Appl. No. 10/231,369, filed Aug. 28, 2002, Steven Teig, Continuation of U.S. Appl. No. 10/215,923.

U.S. Appl. No. 10/233,312, filed Aug. 28, 2002, Steven Teig, Continuation of U.S. Appl. No. 10/215,923.

U.S. Appl. No. 10/227,016, filed Aug. 23, 2002, Steven Teig, Continuation of U.S. Appl. No. 10/215,923.

U.S. Appl. No. 10/226,482, filed Aug. 23, 2002, Steven Teig, Continuation of U.S. Appl. No. 10/215,923.

U.S. Appl. No. 10/285,844, filed Oct. 31, 2002, Steven Teig, Continuation of U.S. Appl. No. 10/215,923.

U.S. Appl. No. 10/286,253, filed Oct. 31, 2002, Steven Teig, Continuation of U.S. Appl. No. 10/215,923.
U.S. Appl. No. 10/288,033, filed Nov. 5, 2002, Steven Teig, Continuation of U.S. Appl. No. 10/215,923.
U.S. Appl. No. 10/335,179, filed Dec. 31, 2002, Steven Teig, Continuation of U.S. Appl. No. 10/215,923.
U.S. Appl. No. 10/285,758, filed Oct. 31, 2002, Steven Teig, Continuation of U.S. Appl. No. 10/215,923.
U.S. Appl. No. 10/286,598, filed Oct. 31, 2002, Steven Teig, Continuation of U.S. Appl. No. 10/215,896.
U.S. Appl. No. 10/286,584, filed Oct. 31, 2002, Steven Teig, Continuation of U.S. Appl. No. 10/215,896.
U.S. Appl. No. 10/335,074, filed Dec. 31, 2002, Steven Teig et al., CIP of U.S. Appl. Nos. 10/215,923, 10/215,896, and 10/215,563.
U.S. Appl. No. 10/334,665, filed Dec. 31, 2002, Steven Teig et al., CIP of U.S. Appl. Nos. 10/215,923, 10/215,896, and 10/215,563.
U.S. Appl. No. 10/335,243, filed Aug. 31, 2002, Steven Teig et al., CIP of U.S. Appl. Nos. 10/215,923, 10/215,896, and 10/215,563.
U.S. Appl. No. 10/066,060, filed Jan. 31, 2002, Steven Teig, Parent application of U.S. Appl. No. 10/215,563.
U.S. Appl. No. 10/066,160, filed Jan. 31, 2002, Steven Teig et al., Parent application of U.S. Appl. No. 10/215,563.
U.S. Appl. No. 10/066,095, filed Jan. 31, 2002, Steven Teig et al., Parent application of U.S. Appl. No. 10/215,563.
U.S. Appl. No. 10/066,047, filed Jan. 31, 2002, Steven Teig et al., Parent application of U.S. Appl. No. 10/215,563.
U.S. Appl. No. 10/061,641, filed Jan. 31, 2002, Steven Teig et al., Parent application of U.S. Appl. No. 10/215,563.
U.S. Appl. No. 10/066,094, filed Jan. 31, 2002, Steven Teig et al., Parent application of U.S. Appl. Nos. 10/215,563 and 10/215,896.
U.S. Appl. No. 10/076,121, filed Feb. 12, 2002, Steven Teig, Parent application of U.S. Appl. Nos. 10/215,563 and 10/215,896.
U.S. Appl. No. 10/062,995, filed Jan. 31, 2002, Steven Teig et al., Parent application of U.S. Appl. No. 10/215,563.
U.S. Appl. No. 10/066,102, filed Jan. 31, 2002, Steven Teig et al., Parent application of U.S. Appl. No. 10/215,563.
U.S. Appl. No. 10/066,187, filed Jan. 31, 2002, Steven Teig et al., Parent application of U.S. Appl. No. 10/215,563.
Chen, H.F. et al., A Faster Algorithm for Rubber–Band Equivalent Transformation for Planar VLSI Layouts, IEEE Transactions on Computer–Aided Design of Integrated Circuits and Systems, vol. 15, No. 2, feb. 1996, pp. 217–227.
Dayan, T. et al., Layer Assignment for Rubber Band Routing, UCSC–CRI–93–04, Jan. 20, 1993.
Dayan, T., Rubber–Band Based Topological Router, A Dissertation, UC Santa Cruz, Jun. 1997.
Hama, T. et al., Curvilinear Detailed Routing Algorithm and its Extension to Wire–Spreading and Wire–Fattening.
Hama, T. et al., Topological Routing Path Search Algorithm with Incremental Routability Test, IEEE Transactions on Computer–Aided Design of Integrated Circuits and Systems, vol. 18, No. 2, Feb. 1999, pp. 142–150.
Kobayashi, K. et al., A New Interactive Analog Layout Methodology based on Rubber–Band Routing, UCSC–CRL–96–12, Jun. 13, 1996.
Lim, A. et al, A Fast Algorithm To Test Planar Topological Routability, Technical Report 94–012, pp. 1–16.

Lu, Y., Dynamic Constrained Delaunay Triangulation and Application to Multichip Module Layout, A Thesis for Master of Science, UC Santa Cruz, Dec. 1991.
Maley, F.M., Testing Homotopic Routability Under Polygonal Wiring Rules, Algorithmica 1996, 15: 1–16.
Morton, P. B. et al., An Efficient Sequential Quadratic Programming Formulation of Optimal Wire Spacing for Cross–Talk Noise Avoidance Routing, UCSC–CRL–99–05, Mar. 10, 1999.
Staepelaere, D. et al., Geometric Transformations for a Rubber–Band Sketch, A Thesis for a Master of Science in Computer Engineering, UCSC, Sep. 1992.
Staepelaere, D. et al., Surf: A Rubber–Band Routing System for Multichip Modules, pp 18–26, 1993.
Su, J. et al., Post–Route Optimization for Improved Yield Using Rubber–Band Wiring Model, 1997 International Conference on Computer–Aided Design, pp 700–706, Nov. 1997.
Wei–Ming Dai, W. et al., Routability of a Rubber–Band Sketch. $28^{th}$ ACM–IEEE Design Automation Conference, 1991. pp. 45–65.
Xing, Z. et al., A Minimum Cost Path Search Algorithm Through Tile Obstacles, slide presentation.
Xing, Z. et al., Shortest Path Search Using Tiles and Piecewise Linear Cost Propagation, IEEE, 2002, pp. 145–158.
Xu, A More Efficient Distance Vector Routing Algorithm, UCSC–CRL–96–18, Mar. 1997.
Yu, M.–F. et al., Fast and Incremental Routability Check of a Topological Routing Using a Cut–Based Encoding, UCSC–CRL–97–07, Apr. 14, 1997.
Yu, M.–F. et al, Interchangeable Pin Routing with Application to Package Layout, UCSC–CRL–96–10, Apr. 25, 1996.
Yu, M.–F. et al., Pin Assignment and Routing on a Single–Layer Pin Grid Array, UCSC–CRL–95–15, Feb. 24, 1995.
Yu, M.–F. et al., Planar Interchangeable 2–Terminal Routing, UCSC–CRL–95–49, Oct. 19, 1995.
Yu, M.–F. et al., Single–Layer Fanout Routing and Routability Analysis for Ball Grid Arrays, UCSC–CRL–95–18, Apr. 25, 1995.
Ahuja, R. et al., Faster Algorithms for the Shortest Path Problem, Journal of the Association for Computing Machinery, vol. 37, No. 2, Apr. 1990, pp. 213–223.
Bagga, J. et al., Internal, External, and Mixed Visibility Edges of Polygons.
Berger, B. et al., Nearly Optimal Algorithms and Bounds for Multilayer Channel Routing, Journal of the Association for Computing Machinery, pp. 500–542, Mar. 1995.
Chen et al., Optimal Algorithms for Bubble Sort Based Non–Manhattan Channel Routing, May 1994, Computer–Aided Design of Integrated Circuits and Systems, IEEE Transactions Volume: 13 Issues, pp. 603–609.
Cheng, K., Steiner Problem in Octilinear Routing Model, A Thesis submitted for the Degree of Master of Science, National University Singapore, 1995, pp. 1–122.
Chiang, C. et al., Wirability of Knock–Knee Layouts with 45° Wires, IEEE Transactions on Circuits and Systems, vol. 38, Issue 6, pp 613–624, Jun. 1991.
Cong, J. et al., Efficient Heuristics for the Minimum Shortest Path Steiner Arborescence Problem with Applications to VLSI Physical Design, Cadence Design Systems, pp. 88–95.
Cong, J. et al., Multilevel Approach to Full Chip Gridless Routing, Nov. 2001, IEEE, pp. 396–403.

Cong, J. et al., Performance Driven Multi–Layer General Routing for PCB/MCM Designs, UCLA Computer Science Department, 1998, pp. 356–361.

Gao, S. et al., Channel Routing of Multiterminal Nets, Journal of the Association for Computing Machinery, vol. 41, No. 4, Jul. 1994, pp. 791–818.

Gonzalez, T. et al., A Linear Time–Algorithm for Optimal Routing, Journal of the Association for Computing Machinery, vol. 35, No. 4, Oct. 1988, pp. 810–831.

Guibas, L. et al., Optimal Shortest Path Queries in a Simple Polygon, 1987 ACM, pp. 50–63.

Hachtel, G.D. et al., Linear Complexity Algorithms for Hierarchical Routing, 1/89, IEEE pp 64–80.

Hightower, D., A Solution to Line–Routing Problems on the Continuous Plane, Bell Laboratories, Inc., pp. 11–34.

Iso, N. et al., Efficient Routability Checking for Global Wires in Planar Layouts, IEICE Trans. Fundamentals, vol. E80–A, No. 10 Oct. 1997, pp. 1878–1882.

Khoo, K. et al., An Efficient Multilayer MCM Router Based on Four–Via Routing, $30^{th}$ ACM/IEEE Design Automation Conference, 1993, pp. 590–595.

Ladage, L. et al., Resistance Extraction Using a Routing Algorithm, $30^{th}$ ACM/IEEE Design Automation Conference, 1993, pp. 38–42.

Leiserson, C. et al., Algorithms for Routing and Testing Routability of Planar VLSI Layouts, pp. 69–78, May 1985.

Lipski, W. et al., A Unified Approach to Layout Wirability, Mathematical Systems Theory, 1987, pp. 189–203.

Lodi, E. et al., A 2d Channel Router for the Diagonal Model, pp. 111–125, Apr. 1991.

Lodi, E. et al., Lecture Notes in Computer Science, a 4d Channel router for a two layer diagonal model, pp. 464–476, Jul. 1988.

Lodi, E. et al., Routing in Times Square Mode, pp. 41–48, Jun. 1990.

Lodi, E. et al., Routing Multiterminal Nets in a Diagonal Model, pp. 899–902, 1988.

Nestor, J. A New Look at Hardware Maze Routing, Proceedings of the $12^{th}$ ACM Symposium on Great Lakes Symposium on VLSI, pp 142–147, Apr. 2002.

Overtone, G., EDA Underwriter 2 Finding Space in a Multi–Layer Board, Electronic Engineering, Morgan–Grampian LTD, Mar. 1995, vol. 67, No. 819, pp 29–30.

Powers, K. et al., The 60° Grid: Routing Channels in Width d/square root 3, VLSI, 1991, Proceedings., First Great Lakes Symposium on Kalamazoo, MI, USA, pp 214–291, Mar. 1991.

Schiele, W. et al., A Gridless Router for Industrial Design Rule, $27^{th}$ ACM–IEEE Design Automation Conference, pp. 626–631, 1990.

Sekiyama, Y. et al., Timing–Oriented Routers for PCB Layout Design of High–Performance Computers, International Conference on Computer Aided Design, pp 332–335, Nov. 1991.

Soukup, J. et al., Maze Router Without a Grid Map, IEEE, 1992, pp. 382–385.

Takashima, Y. et al, Routability of FPGAs with External Switch–Block Structures, IEICE Trans. Fundamentals, vol. E81–A, No. 5, May 1998, pp. 850–856.

Yan et al., Three–Layer Bubble–Sorting –Based Non–Manhattan Channel Routing, ACM Transactions on Design Automation of Electronic Systems, vol. 5, No. 3, Jul. 2000, pp. 726–734.

Zhou, H. et al., An Optimal Algorithm for River Routing with Crosstalk Constraints, 1996.

Zhou, H. et al., Optimal River Routing with Crosstalk Constraints, ACM Transactions on Design Automation of Electronic Systems, vol. 3, No. 3, Jul. 1998, pp. 496–514.

* cited by examiner

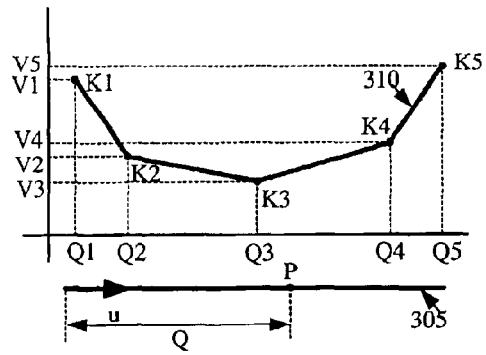
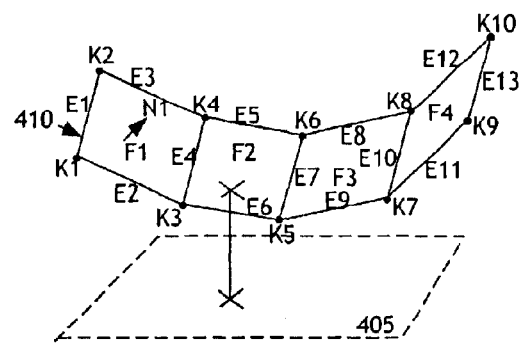
*Figure 3*　　　　　*Figure 4*
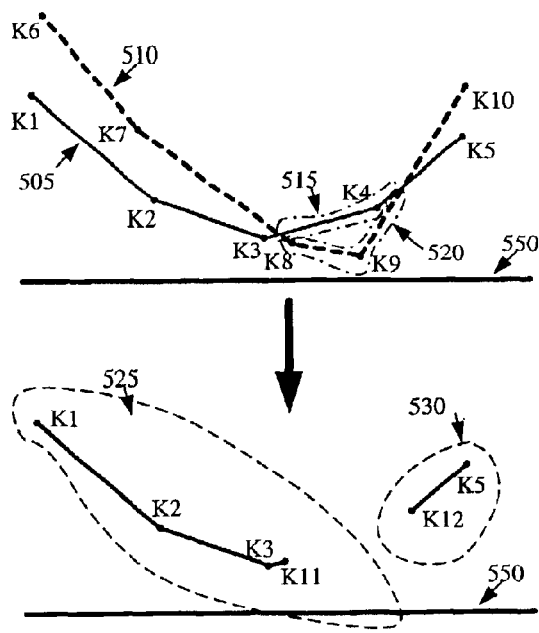
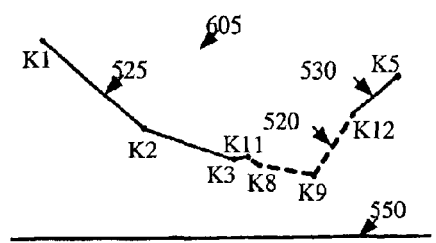
*Figure 5*　　　　　*Figure 6*

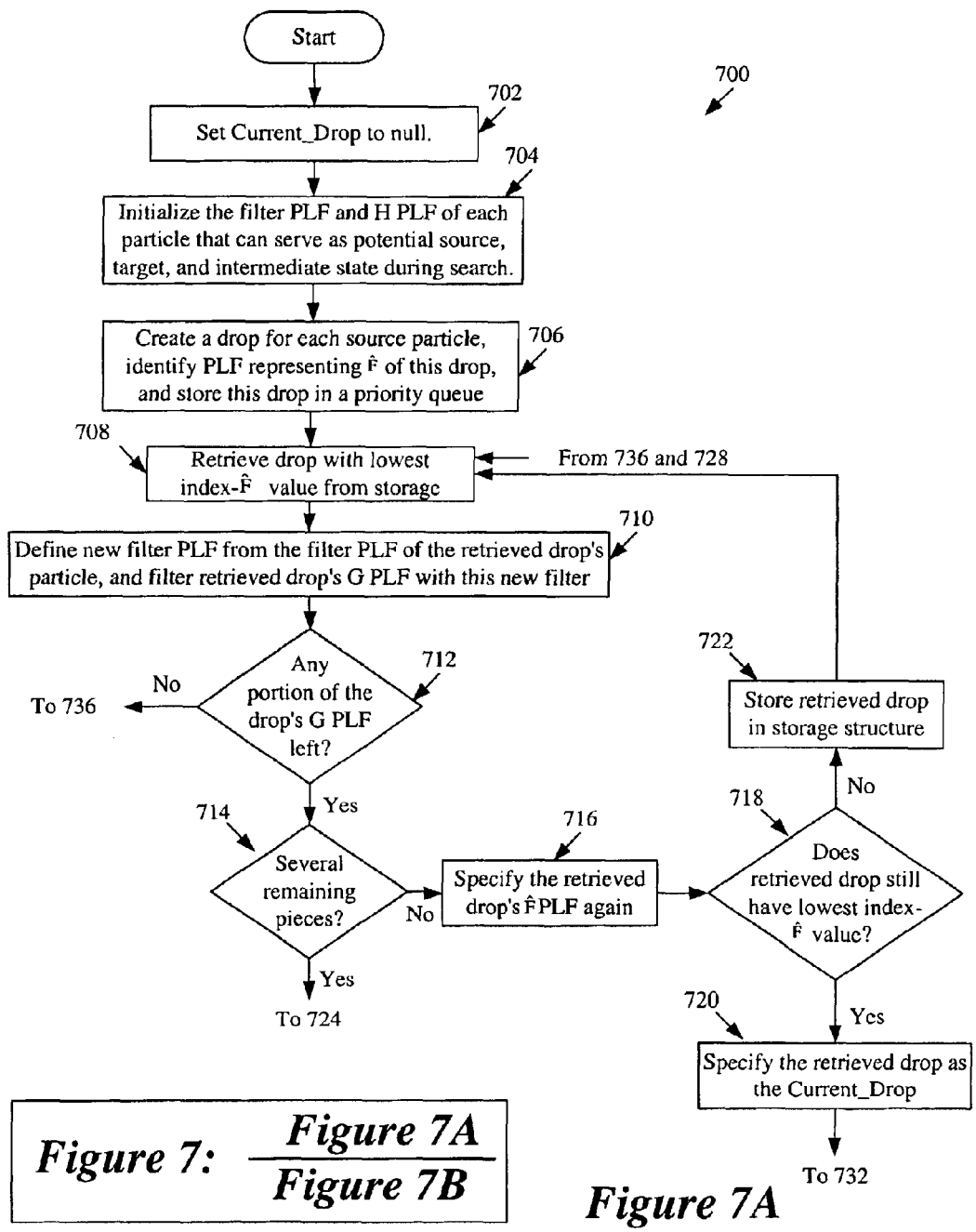

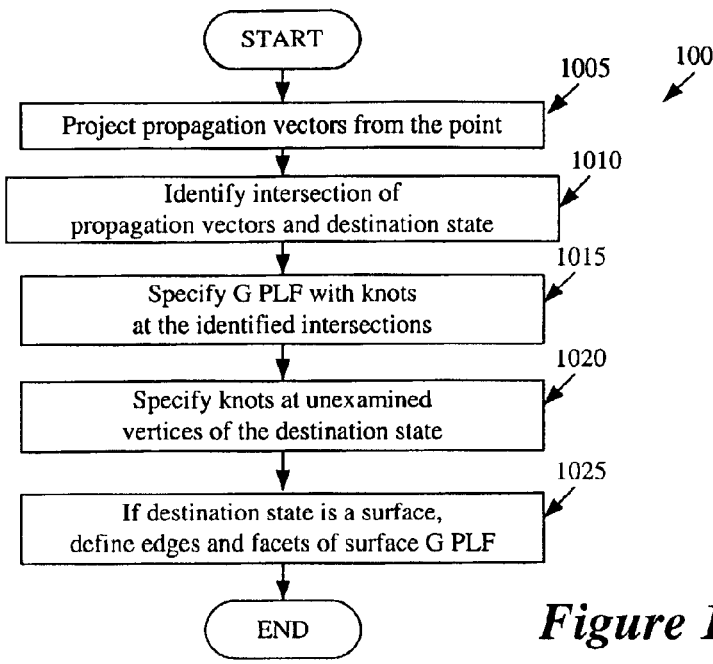
*Figure 10*
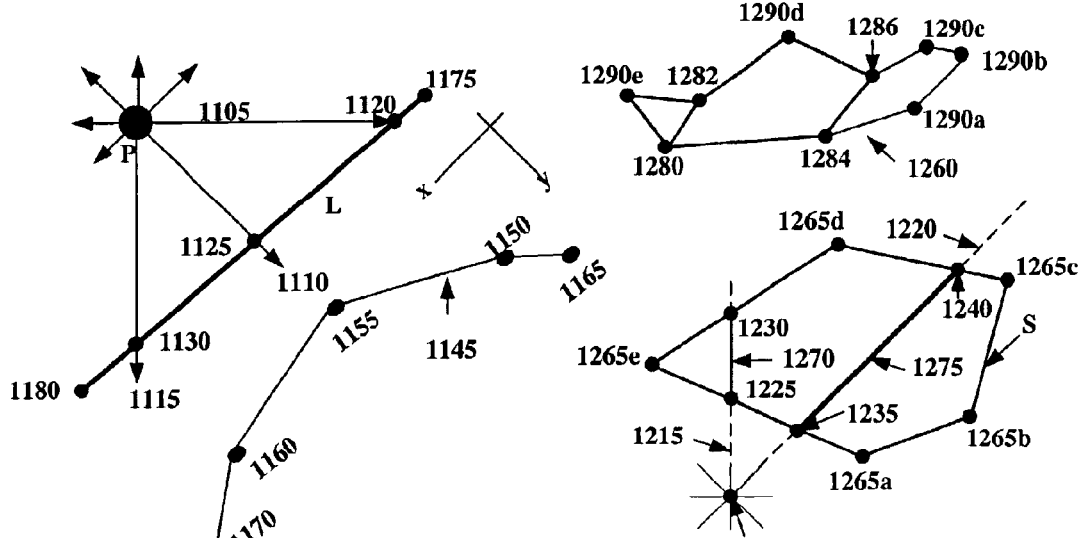
*Figure 11*
*Figure 12*

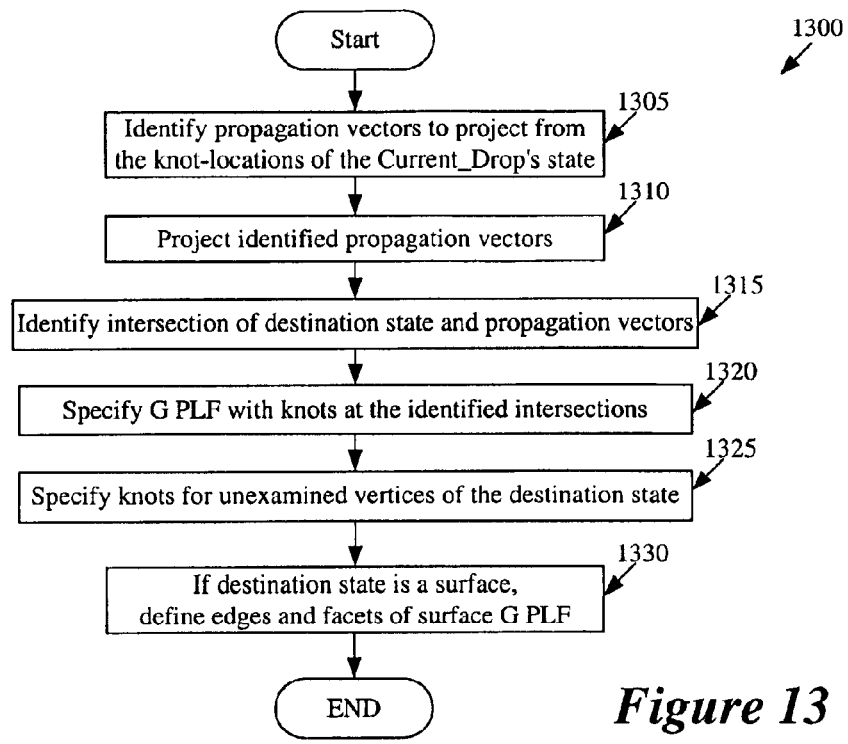
*Figure 13*
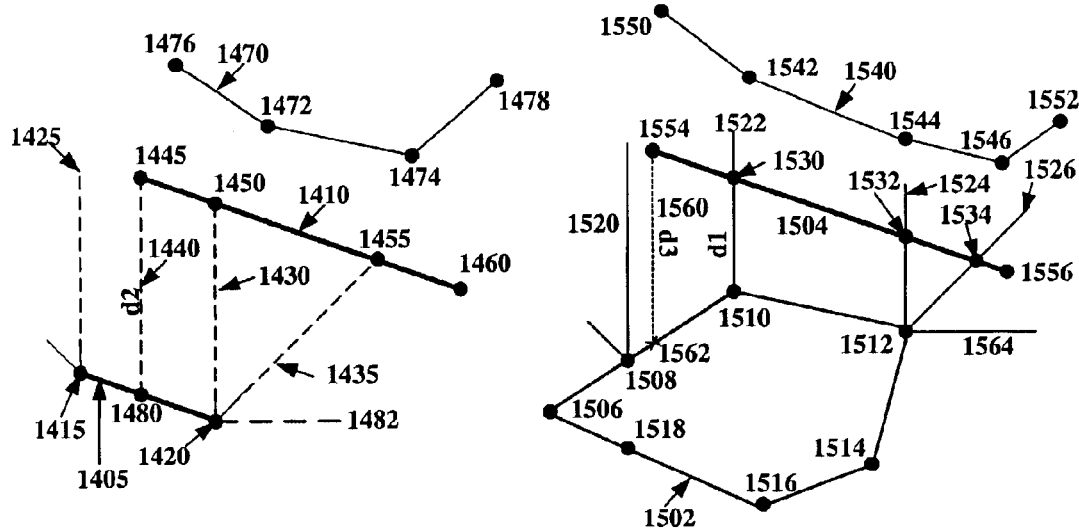
*Figure 14*     *Figure 15*

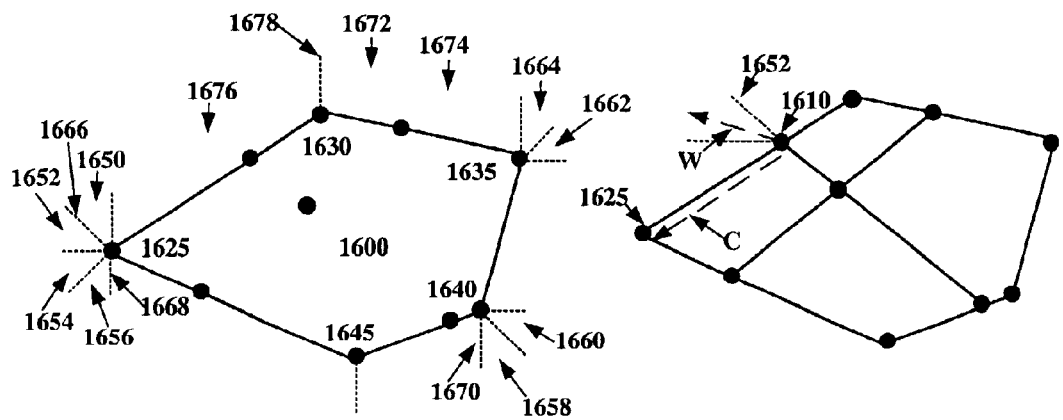
*Figure 16*          *Figure 17*
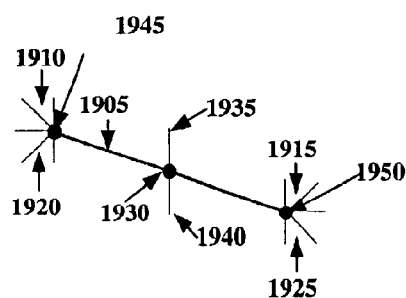
*Figure 19*
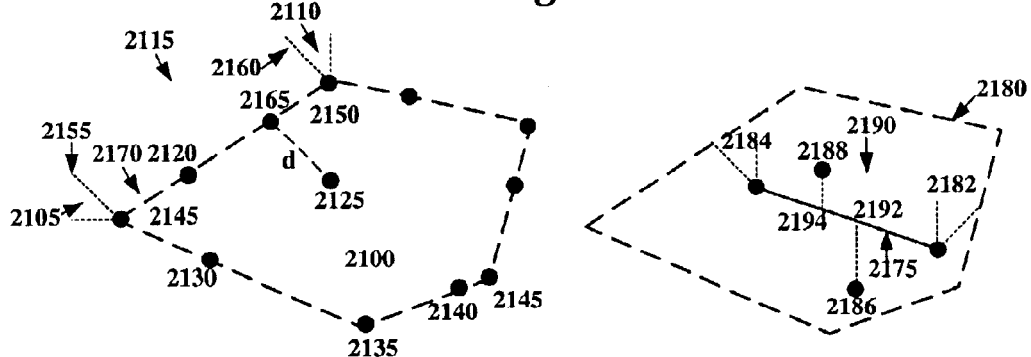
*Figure 21A*          *Figure 21B*

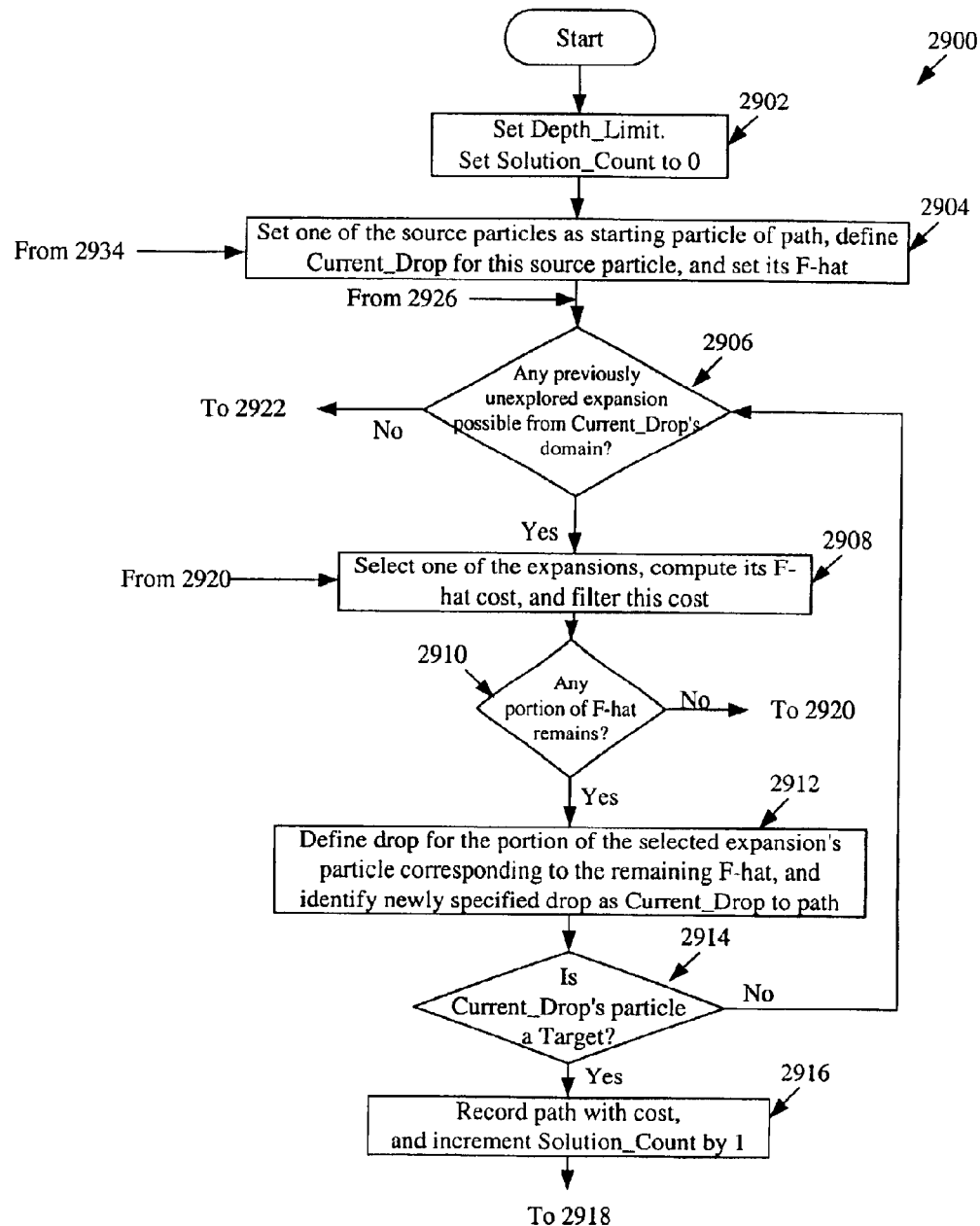

METHOD AND APPARATUS FOR PROPAGATING A FUNCTION

CLAIM OF BENEFIT TO PROVISIONAL APPLICATION

This patent application claims the benefit of the following U.S. Provisional patent applications: (1) 60/396,571, filed Jul. 15, 2002; (2) 60/388,518, filed Jun. 12, 2002; and (3) 60/385,975, filed Jun. 4, 2002. This application is also a continuation-in-part of the following U.S. patent applications: (1) 10/215,923, filed Aug. 9, 2002, (2) 10/215,896, filed Aug. 9, 2002, and (3) 10/215,563, filed Aug. 9, 2002. This application incorporates each of its parent applications by reference.

FIELD OF THE INVENTION

The invention is directed towards method and apparatus for propagating a function.

BACKGROUND OF THE INVENTION

A best-first search is an iterative search that at each iteration tries to extend the partial solution with the best estimated cost. Best-first searches have often been used to identify the shortest path between source and target points in a multi-point search space. One such best-first search is the A* search. To identify a path between source and target points, the A* search starts one or more paths from the source and/or target points. It then iteratively identifies one or more path expansions about the lowest cost path, until it identifies a path that connects the source and target points.

The typical cost of a path expansion in an A* search is an $\hat{F}$ cost, which is the cost of the path leading up to the path expansion plus an estimated cost of reaching a target point from the path expansion. An $\hat{F}$ cost of a path that has reached a particular point can be expressed as follows:

$$\hat{F} = G + \hat{H}.$$

In this formula, G specifies the cost of the path from a source point to the particular point through the sequence of expansions that led to the particular point, while $\hat{H}$ specifies the estimated lower-bound cost from the particular point to a target point.

An A* search is not suitable for finding the lowest-cost path in a graph with non-zero dimensional states. This is because the A* search computes a single cost value for the expansion to any state in the graph, while the actual cost can vary across a non-zero dimensional state. Accordingly, there is a need for a path search process that can identify the lowest-cost path in a graph with non-zero dimensional states.

SUMMARY OF THE INVENTION

Some embodiments provide a method of propagating a first function, which is defined over a first state, to a second state in a multi-state space. The method identifies vectors to project from at least some points on the first state that serve as locations of inflection points in the first function; where the vectors are identified based on a model that allows penalizes measurements in certain directions. Based on the projected vectors, the method then computes the second function from the first function.

BRIEF DESCRIPTION OF THE DRAWINGS

The novel features of the invention are set forth in the appended claims. However, for purpose of explanation, several embodiments of the invention are set forth in the following figures.

FIGS. 3 and 4 illustrate examples of line and surface PLF's.

FIG. 5 presents an example of filtering a first filtered PLF by a second filter PLF, where both PLF's are defined across a line.

FIG. 6 illustrates the minimum PLF for the two PLF's of FIG. 5.

FIG. 10 illustrates a process that propagates a PLF that is defined over a point to a line or a surface.

FIGS. 11 and 12 illustrate examples of propagating a PLF from a point P to a line L and to a surface S.

FIG. 13 illustrates a process for propagating a PLF from a line to another line or from a surface to a line, and FIGS. 14 and 15 provides examples for describing this process.

FIGS. 16–21 illustrate how some embodiments identify the propagation vectors that emanate from the knot locations of a line PLF or surface PLF.

DETAILED DESCRIPTION OF THE INVENTION

Figure 1:
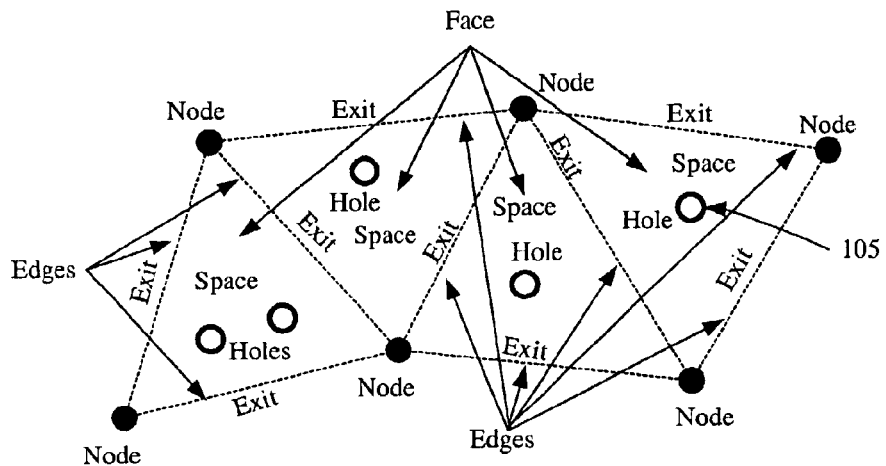
FIG. 1 illustrates a portion of a layer that has been triangulated into four triangular faces, each of which has a space, three nodes, and three edges, while FIG. 2 provides examples of topological routes that are formed by via nodes, Steiners, walls, joints, and nodes.

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide path search processes that identify paths between source and target states in a multi-layer graph with non-zero dimensional states. These paths traverse through intermediate states often but not always. In some embodiments described below, a zero-dimensional state is a point, a one-dimensional state is a line, a two-dimensional state is a surface, a three-dimensional state is a volume, etc.

The path search processes of these embodiments can be used in many different applications. However, the embodiments described below use the path search processes in topological routers that define topological routes for nets in design layouts of integrated circuits. Accordingly, in these embodiments, the multi-layer graph that each path search explores is a tessellated region of an IC layout. In this tessellated region, the source, intermediate, and target states for a path search are zero, one-, or two-dimensional topological particles. In other embodiments, the source, target, and intermediate states might be higher dimensional states (e.g., three-dimensional volumes, etc.).

Two different path search processes are described below. The first process performs a variant of a best-first search. The best first search is Q*, and this search is described in U.S. patent Application Ser. No. 10/215,923, which was filed on Aug. 9, 2002. The application Ser. No. 10/215,923 is incorporated herein by reference. The variant of the Q* search that is described below is called a Q-epsilon*, or Qe*, search. The Q* search finds the lowest-cost path between source and target sets, whereas the Qe* search identifies a path that has a cost within e of the lowest-cost path. The second process described below is a depth-first search, that is referred to below as an IDQ* search. One of ordinary skill will realize that other embodiments might use other types of path searches, such as other depth-first searches. Before describing these searches, an overview of the tessellated layout region that these searches explore is first provided.

I. OVERVIEW OF THE REGION FOR THE PATH SEARCH

In the embodiments described below, the path search processes are used in a topological router that defines topological routes that connect the routable elements (e.g., pins) of nets in a region of a design layout. Two topological routers are described in U.S. patent Application Ser. No. 10/215,896, which was filed Aug. 9, 2002. The application Ser. No. 10/215,896 is incorporated in the present application by reference.

The topological router initially tessellates the IC-layout region, and then embeds topological routes in the tessellated region. At times, this router further tessellates the region after embedding a route. The topological router can tessellate (i.e., decompose) the region in different types of polygons, such as rectangles, etc. In the embodiments described below, each layer of the IC-layout region is decomposed into triangular faces. The above-incorporated application Ser. No. 10/215,896 describes in detail the triangulation and embedding operations. However, the triangulation and embedding operations are briefly described below, in order to describe the tessellated region that path search processes explore in some embodiments. The wiring model that some embodiments use is also described briefly below.

A. Triangulated Region After the Initial Triangulation

The initial triangulation results in numerous triangular faces. Each resulting face has 3 edges, 3 nodes, a space representing the topological regions inside the face, and possibly a set of holes representing potential vias within the space. Nodes, edges, spaces, and holes are illustrated in FIG. 1, which presents a portion of an IC-layout layer after the initial triangulation. This figure illustrates four triangular faces, each with three nodes, three edges between the three nodes, and a space.

Some embodiments define nodes at the four corners of the layout region on each layer, at the vertices of the obstacle and pin geometries in the region, and at some or all virtual pins in the region (where virtual pins or "vpins" are points defined at the boundary of the region to account for the propagation of previously defined global routes into the region). Edges are defined between certain pairs of nodes in order to triangulate the region. Some embodiments define each edge as an ordered list of topological particles in the tessellated region. After the initial triangulation, each edge's ordered list starts and ends with a node, and has a topological particle, called an "exit," between the two nodes. For each edge, FIG. 1 illustrates two nodes and an exit between the two nodes.

The topological router defines a hole between each overlapping pair of spaces that have sufficiently large overlap to accommodate a via. To determine whether two spaces have sufficient overlap, the topological router maintains for each space a polygon that specifies the legal area where the center of vias can be in the space. The topological router then identifies the intersection of the polygons of each pair of overlapping spaces. For each overlapping space pair that has a sufficiently large polygon intersection, the router then specifies a hole to represent a potential via that can be anywhere in the identified polygonal intersection. A hole is part of both spaces that it connects. A space can contain several holes, one for each sufficiently overlapping space in an adjacent layer. FIG. 1 illustrates holes in several spaces. The topological router performs its hole-identification process for a space each time it creates or modifies a space. The above-incorporated application Ser. No. 10/215,896 further described how some embodiments identify holes.

B. Triangulated Region with Embedded Routes

After the initial triangulation, the topological router embeds topological routes in the decomposed topological region. The topological router defines a topological route as an ordered list of topological particles in the decomposed topological region. Each embedded topological route is a graph that has several vertices and one or more wire segments that connect some or all the vertices. In the embodiments described below, the wire segments are referred to as walls and the vertices can be nodes, holes, "joints," "via nodes," and "Steiners."

A "joint" is a topological particle that the topological router defines along an edge (i.e., in the edge's ordered list) when this router embeds a path that crosses the edge. A joint divides a previously undivided exit of an edge into two exits. Via nodes are topological particles that the router creates when it embeds a topological path (all or some of a topological route) that utilizes a hole. Specifically, to embed a path of a net that uses a hole, the router converts the hole into two via nodes, one in each space connected by the hole, and establishes an association between the two via nodes (e.g., has them refer to one another). A Steiner is a Steiner point (i.e., a vertex that connects to more than two walls) that is generated at the juncture between a pre-existing path of a net and a newly embedded path of the net. When the router embeds a path that crosses an edge, it defines a joint at the intersection of the edge and the net's path. A joint divides a previously undivided exit of an edge into two exits.

Figure 2:
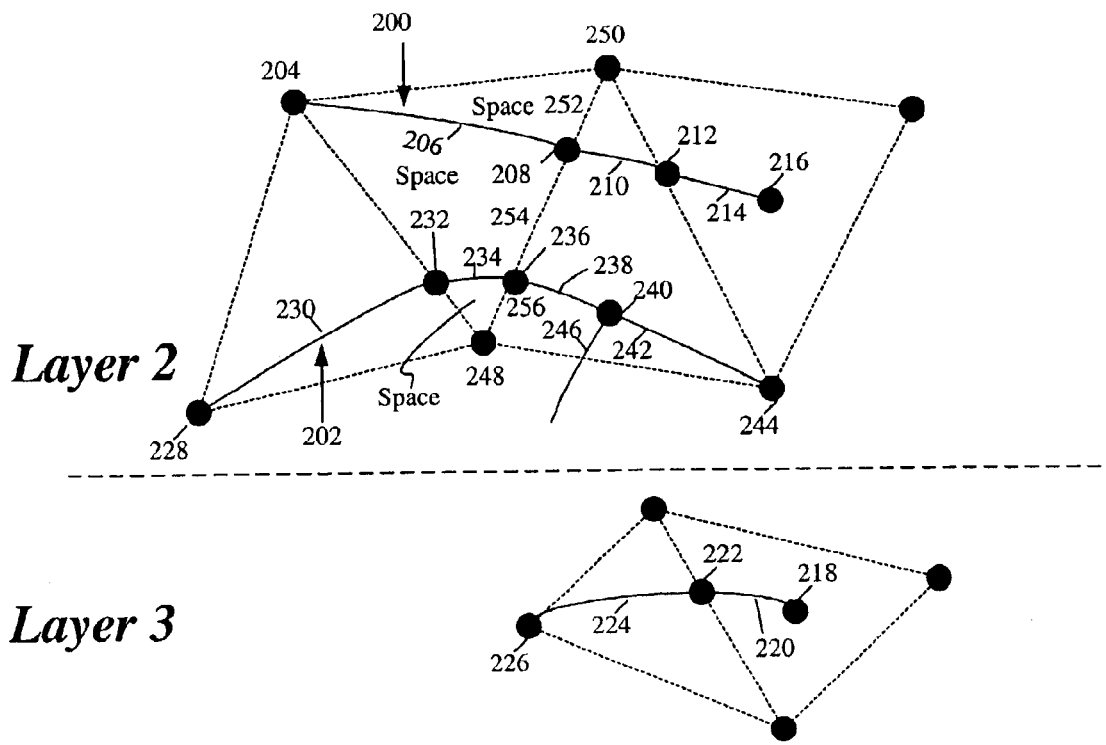

FIG. 2 illustrates two embedded topological paths 200 and 202. Both of these paths traverse several triangular faces on layer 2. Path 200 also traverses two triangular faces on layer 3, as it is a multi-layer route. Path 200 is specified by the following ordered list of particles: node 204, wall 206, joint 208, wall 210, joint 212, wall 214, via node 216, via node 218, wall 220, joint 222, wall 224, and node 226. Path 202 is specified by the following ordered list of particles: node 228, wall 230, joint 232, wall 234, joint 236, wall 238, Steiner 240, wall 242, and node 244. FIG. 2 also illustrates a wall 246 of another portion of path 202's route.

As shown in this figure, the embedded routes divide the faces that they completely cross into several spaces. For instance, these paths divide the face formed by vertices 204, 248, and 250 into three spaces. Also, this figure illustrates that each joint is at the intersection of a route with an edge, and abuts two exits on its edge. The Steiner 240 of path 202 connects walls 238, 242, and 246. In addition, multi-layer route 200 includes two via nodes 216 and 218. These via nodes enable this path to traverse layers 2 and 3. The topological router generated these two via nodes from the hole 105 of FIG. 1 when it embedded the path 200. FIG. 2 also illustrates that a wall is specified between each to non-wall, non-via particles on a path.

Each net has a representation of its connectivity and topology. Each edge has an ordered list of the routes that cross it. In other words, a route's topological particles that are on edges appear on their edge's ordered list (e.g., linked list) in the topological order that their route crosses their edge. For the example illustrated in FIG. 2, the topological router specifies the edge between nodes 248 and 250 as an ordered list of the following particles: node 250, exit 252, joint 208, exit 254, joint 236, exit 256, and node 248. In this edge's ordered list, joints 208 and 236 of paths 200 and 202 appear in the order that their routes cross this edge.

Every particle that is within a face or is on an edge of the face is associated with one or more spaces of the face. Some particles can be part of multiple spaces. Each space contains its face's nodes and exits just after the initial triangulation. The topological router stores each edge's capacity and length, and also stores the wire flow (route flow) across each edge.

In the embodiments described below, certain particles (such as joints, via nodes, walls, and Steiners) that define a route are moveable, while other route-defining particles (such as pin-geometry nodes) have a fixed location. The topological router does not need to specify and store the location of moveable route-defining particles, as the routes are topologically defined. However, in the embodiments described below, the topological router specifies and stores locations for the route-defining particles in order to be able to compute wirelength accurately.

C. Wiring Model

Different embodiments of the invention use different wiring models. The embodiments described below use a wiring model that specifies horizontal, vertical, and ±45° diagonal wiring on each layer. This wiring model, however, is a preferred direction model that has one preferred wiring direction on each layer. This wiring model costs wiring in the preferred direction of a particular layer less expensively than the non-preferred directions on that layer. Specifically, on each particular layer L, the length of the wiring in each particular wiring direction is multiplied by a scalar constant ($S_H^L$, $S_V^L$, $S_{-45}^L$ or $S_{45}^L$) for the particular direction. The scalar constant of the preferred direction on a layer is smaller than the scalar constants of the other wiring directions on the layer. For instance, when the preferred direction on layer 2 is vertical, the scalar constant $S_V^2$ is smaller than the constants $S_H^2$, $S_{-45}^2$, and $S_{45}^2$. This wiring model is referred to below as the preferred-direction octilinear wiring model.

One of ordinary skill will realize that other embodiments might use other types of wiring models. For instance, some embodiments might use a non-preferred-direction wiring model that is described in the above-incorporated application Ser. No. 10/215,896. This wiring model has four preferred wiring directions (horizontal, vertical, and ±45° directions) on each layer, and thereby does not use any scalar constant multipliers. Other embodiments might use scalar constant multipliers with non-preferred direction wiring models. For instance, some embodiments might have a layer that has more than three wiring directions (e.g., four) but only two of these directions as preferred directions on the layer. Such an embodiment could then use the same scalar multiplier constant for the two preferred direction but use larger scalar values for the other allowed routing directions on that layer.

II. $Q_E^*$ PATH SEARCH

A. Overview.

The Qe* path search identifies a path between source and target states in a multi-layer graph with non-zero dimensional states. The identified path has a cost that is within e of the lowest-cost path between the source and target states. In the embodiments described below, the source, intermediate, and target states in the graph are zero-, one-, or two- dimensional topological particles in the tessellate region. In other words, these states are points (i.e., nodes), lines (i.e., edge- and wall-segments to which a path can expand), and surfaces (i.e., portions of hole polygons to which a path can expand).

In some embodiments, the Qe* search process has two phases: (1) a path exploration phase, during which the process identifies a path between the specified source and target particles, and (2) a path-embedding phase, during which the process embeds the identified path. During the path exploration phase, the Qe* search starts one or more paths from the source set. It then iteratively identifies one or more expansions about the lowest cost path that it has previously identified, until it identifies a path that connects the source and target states. Each identified expansion about a path is from a "current particle" (also called "start particle"), reached by the path, to a "destination particle" that neighbors the current particle.

The embodiments described below cost each expansion based on an $\hat{F}$ cost that can be expressed as:

$$\hat{F} = G + \hat{H}. \tag{1}$$

The $\hat{F}$, G, and $\hat{H}$ are functions that are defined over the entire destination particle of an expansion or one or more portions of this destination particle. Specifically, the $\hat{F}$ cost is a function that expresses the estimated cost of a path that traverses from a source through the expansion's destination particle to a target. The G cost is a function that expresses the cost of the path that has reached the expansion's destination particle. The $\hat{H}$ cost is a function that expresses an estimated cost of a path from the expansion's destination particle to the target set.

In the embodiments described below, the $\hat{H}$ cost function expresses the lower-bound estimate of the shortest path from the expansion's destination particle to the target set. Also, in these embodiments, the G function and hence the $\hat{F}$ function account for several different types of path costs, such as a distance cost, route-piercing cost, via cost, etc. Hence, the $\hat{F}$ function of equation (1) allows the embodiments described below to identify a path between the source and target sets that has a cost within e of the lowest-cost path between these two sets. Other embodiments, however, might utilize a different $\hat{F}$ function, as further described below.

In the embodiments described below, the G, $\hat{H}$, and $\hat{F}$ functions are convex piecewise linear functions ("PLF"), although in other embodiments they might be other types of functions. In the embodiments described below, each PLF's domain is either a point, a line, or a surface in the tessellated region. In the discussion below, PLF's that are defined over a point are called point PLF's, PLF's that are defined across lines are called line PLF's, and PLF's that are defined across surfaces are called surface PLF's.

A point PLF maps the point over which it is defined to a single value. A line PLF is a PLF with a domain that is a line.

Such a PLF can be specified by a sequence of vertices, called knots, that represent the endpoints of its line segments. FIG. 3 illustrates an example of a line PLF 310 that has four line segments. This PLF specifies a PLF-value for each point P that is offset by an amount Q along an edge 305 (i.e., for each real number Q that defines a point P on the edge at Q·u, where u is a unit vector of L). Each knot of a line PLF can be specified in terms of an offset value Q and a PLF-value V. Also, the knots of a line PLF can be sorted in an order based on their offset values. Accordingly, the five knots K1–K5 that are at the endpoints of PLF 310's four line segments can represent this PLF of FIG. 3. These five knots can be represented by the following ordered list of offset and PLF-value pairs: (Q1, V1), (Q2, V2), (Q3, V3), (Q4, V4), (Q5, V5).

A surface PLF is a set of one or more planar surfaces, called facets. FIG. 4 illustrates an example of a surface PLF. This PLF 410 has four facets (F1–F4), each of which has a different slope. This PLF is defined across a surface 405. For each x-y value in the surface 405, the surface PLF 410 provides a PLF-value (V).

Each surface PLF can be represented by a set of knots, a set of edges between the knots, and a set of facets defined by the edges. Using this approach, the surface PLF 410 of FIG. 4 can be represented by a list of knots K1–K10, a list of edges E1–E13, and a list of facets F1–F4. Some embodiments represent (1) a surface-PLF knot with an x,y coordinate, a PLF-value at that coordinate, and a list of edges that are incident upon the knot, (2) a surface-PLF edge by a pair of references to two knots that the edge connects, and (3) a surface-PLF facet by a list of edges, a normal vector (e.g., x, y, z coordinate values), and a z-intercept, where z is the axis in which the PLF-values are defined. For instance, in the example in FIG. 4, the list of edges for the knot K1 specifies edges E1 and E2, the list of knots for edge E4 specifies knots K3 and K4, and the list of edges for facet F1 identifies edges E1–E4. For facet F1, a normal vector N1 and a z-intercept are also specified.

In the embodiments described below, the Qe* search maintains another function for each topological particle that can serve as a source, intermediate, or target state in the tessellated region. This function is called a filter function. In the embodiments described below, the filter function is a PLF. A particle's filter function expresses the lowest path cost that the search process has recorded for paths from the source set to each point on the particle during a path search. As further described below, the Qe* search in the embodiments described below uses the particle filter functions to determine whether a potential expansion to a destination particle is a viable one (i.e., whether, for any portion of the destination particle, the expansion specifies a path that is cheaper by at least an epsilon than all previously recorded paths to the destination-particle portion). This search makes this determination for an expansion when it initially identifies the expansion and also later if it expands from it.

Filtering is when a first PLF F1 (a filtered PLF) is compared with a second PLF F2 (a filter PLF) to determine whether any portion of the first PLF F1 needs to be discarded. The filter and filtered PLF's have overlapping domains (i.e., domain(F1)∩domain(F2)≠null). In the embodiments described below, filtering discards the portion of the filtered PLF F1 that is larger than the corresponding portion of the filter PLF (i.e., discards every portion of F1 where F1(V)>F2(V)). FIG. 5 presents an example of filtering a first filtered PLF 505 by a second filter PLF 510, where both PLF's are defined across a line 550. Each PLF is represented by its sequence of knots, which is sorted by the domain-offset values. Knots K1–K5 specify the first PLF while knots K6–K10 specify the second PLF 510. As shown in this figure, this filtering discards portion 515 of PLF 505 as the PLF-values of this portion are larger than the PLF-values of the corresponding portion 520 of filter PLF 510. After the filtering operation, two portions 525 and 530 of the PLF 505 remain. Knots K1–K3 and K11 specify the first remaining portion 525, while knots K12 and K5 specify the second remaining portion (where knots K11 and K12 are at the intersection of the PLF's 505 and 510). Filtering PLF's will be further described below.

The embodiments described below also compute the minimum of two PLF's. A minimum of two PLF's F1 and F2 is another PLF F3 that specifies a PLF-value for each location V in the intersection of F1's domain and F2's domain that is equal to the smallest PLF-value specified by the first and second PLF's for that location (i.e., F3(V) =min(F1(V), F2(V)). FIG. 6 illustrates the minimum PLF 605 for the two PLF's 605 and 610 of FIG. 5. The portion 525 and 530 of this minimum function corresponds to the remaining portion of the filtered PLF 505, while the portion 520 of this minimum function is from the original filter PLF 510. Knots K1–K3, K11, K8, K9, K12, and K5 specify the minimum function 605.

B. Overall Flow of the Oe* Path Search Process

Figure 7B:
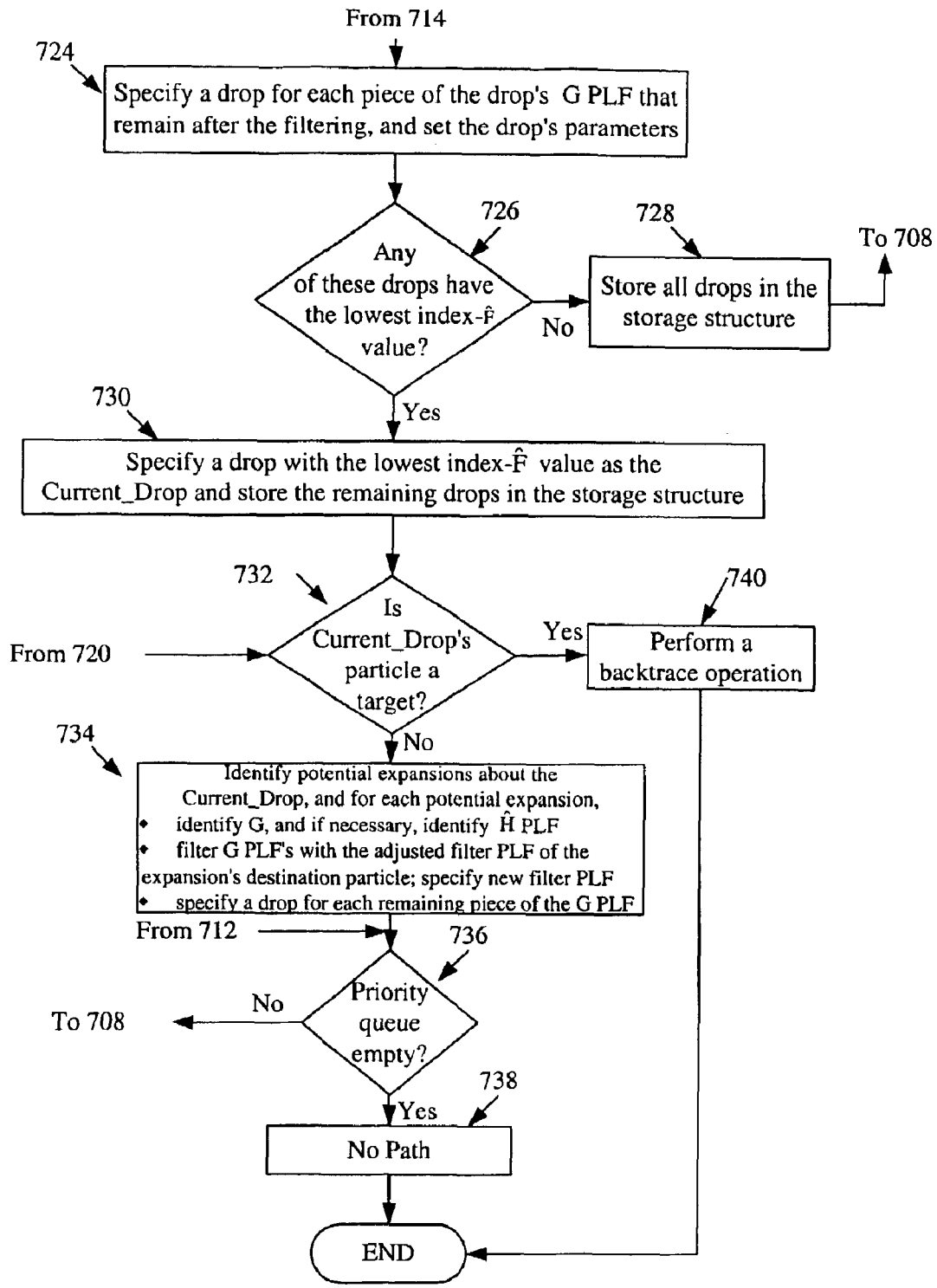
FIG. 7 illustrates a Qe* path search process of some embodiments of the invention.

For some embodiments, FIG. 7 illustrates a Qe* search process that identifies and embeds a path between specified source and target particles in a tessellated region. The process 700 initially sets (at 702) a variable Current_Drop to null. T the process 700 uses drops to represent path expansions. Specifically, this process represents an expansion from one topological particle (called a "start particle" or "current particle") to another topological particle (called a "destination particle") by a "drop" that associates with the destination particle and refers back to the drop of the start particle. One of ordinary skill will realize that other embodiments might not use drops or might implement drops differently.

At 704, the process 700 initializes filter and Ĥ PLF's for each topological particle in the tessellated region that can serve as a start, intermediate, or target particle for a path search. For each such topological particle, the process 700 maintains (1) the filter PLF to express the lowest path cost that the process has been able to identify from the source set to the particle during a path search, and (2) the Ĥ PLF to express the estimated distance between the particle and the target set. The process 700 stores the Ĥ PLF for each particle so that it only has to compute the Ĥ PLF once for each particle. In some embodiments, the process initializes the filter and Ĥ PLF's to "infinity". Also, in the embodiments described below, nodes, exits, and holes are the topological particles that can serve as start particles during a path search, while nodes, holes, exits, and walls are the topological particles that can serve as intermediate and target particles during the path search.

Next, for each source particle of the path search, the process 700 (at 706) identifies and sets the particle's Ĥ PLF and sets the particle's filter PLF to zero. The generation of a particle's Ĥ PLF is described below. At 706, for each source particle, the process 700 also specifies a drop, defines the source particle as the drop's particle, defines the drop's prior drop as null, sets the drop's G PLF to zero, and sets the drop's F̂ PLF equal to the source particle's Ĥ PLF. The process stores the specified drops in a storage structure. In the embodiments described below, the storage structure is a priority queue (e.g., a heap) that is sorted based on a value derived from F̂ PLF of each drop. This value is referred to below as the "index-$\hat{F}$ value." For each drop that is not on a target particle, the index-$\hat{F}$ value is the minimum of the drop's $\hat{F}$ PLF. For a drop that is on a target particle, the index-$\hat{F}$ is this drop's $\hat{F}$-PLY minimum minus epsilon.

At 708, the process then retrieves from the priority queue a drop with the smallest index-$\hat{F}$ value. Next, at 710, the process defines a new filter PLF $FPLF_A$ from the filter PLF of this drop's particle $FPLF_P$. This new filter PLF equals the dropp-article's filter PLF minus epsilon (i.e., $FPLF_A = FPLF_p - e$). At 710, the process then filters the retrieved drop's G PLF with this newly defined filter $FPLF_p$. The process performs this filtering operation to ensure that the retrieved drop is still valid. Specifically, after the process 700 stored the retrieved drop in the priority queue, it might have created and stored other drops that represent cheaper expansions by at least the epsilon e to the same portion of the retrieved drop's particle for which the retrieved drop was defined. These cheaper expansions would have modified the filter PLF of the retrieved drop's particle. Accordingly, after retrieving a drop from the priority queue, the process 700 filters (at 710) the drop's G PLF with the newly defined filter function $FPLF_A$ to ensure that the drop still represents an expansion that is within an epsilon of the best expansion seen thus far to at least a portion of the drop's particle.

Figure 8:
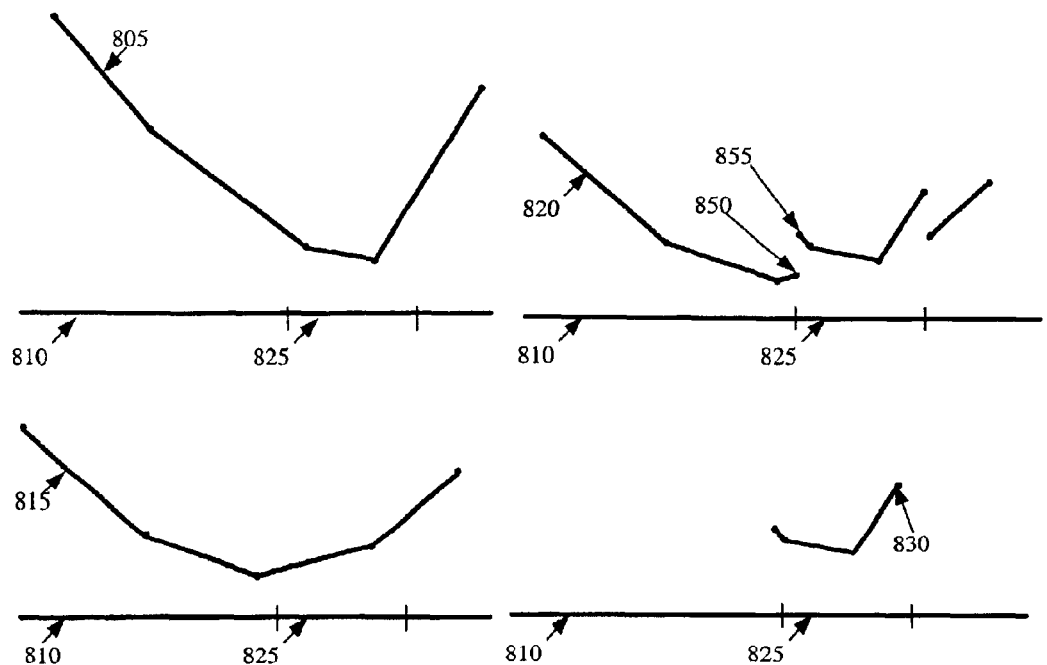
FIGS. 8 and 9 provide examples that describe the process of FIG. 7.

FIG. 8 illustrates one such situation. This figure illustrates a G PLF 805 of a first expansion to a line 810. This G PLF is also the filter function of the line 810 after the first expansion. FIG. 8 illustrates a G PLF 815 of a second expansion to the line 810. The second expansion's G PLF 815 is smaller than the first expansion's G PLF 805 by at least an epsilon over the entire line 810 except for the portion 825 of the line.

As further described below, when the Qe* process identifies an expansion to a particle, it also filters the G PLF of the identified expansion with the adjusted filter function $FPLF_A$ of the particle. If any portion of the G PLF remains after this filtering operation, the process determines that it has identified a viable expansion, and therefore performs several operations. One of these operations is to redefine the filter function of the particle. This redefined filter function is the minimum of the particle current filter function and each portion of the expansion's G PLF that remains after its filtering. Hence, after the second expansion to line 810 is identified, the filter function of line 810 is set to the minimum of the original filter function and every piece of the second expansion's G PLF that remains after being filtered by the adjusted filter function. In FIG. 8, the new filter function after the second expansion is the PLF 820, which is a discontinuous in its range. PLF's easily support such discontinuity by specifying two or more knots (e.g., knots 850 and 855) at the location of the discontinuity.

Accordingly, in this example, once the drop for the first expansion to the line 810 is retrieved, it is filtered by the new filter function 820, which is the line's filter PLF after the second expansion. This filtering results in the PLF 830, which corresponds to the portion of the original PLF 805 of the first expansion that is within an espsilon of the best expansion seen thus far to line 810. This PLF 830 is defined over a much smaller domain (i.e., segment 825) than the original PLF 805 for the first expansion. Filtering and identifying the minimum of two functions will be further described below.

After 710, the process determines (at 712) whether any portion of the retrieved drop's G PLF remains after the filtering operation. If the process determines (at 712) that at least one portion of the G PLF remains after the filtering, the process determines (at 714) whether the filtering operation at 710 resulted in two or more convex pieces of the retrieved drop's G PLF.

If the filtering did not result in two or more convex pieces, the process specifies (at 716) the retrieved drop's $\hat{F}$ PLF again, as some portions of this drop's G PLF might have been discarded because of the filtering operation, and such a modification would discard some portions of this drop's $\hat{F}$ PLF. Next, the process determines (at 718) whether the retrieved drop's index-$\hat{F}$ value is greater than the smallest index-$\hat{F}$ value of the drops that are currently stored in the priority queue. If so, the process stores (at 722) the retrieved drop again in the priority queue, and then transitions back to 708 to select another drop. Otherwise, the process specifies (at 720) the retrieved drop as the Current_Drop and then transitions to 732, which will be further described below.

If the process determines (at 714) that the filtering at 710 resulted in two or more convex pieces of the retrieved drop's G PLF, the process specifies (at 724) a drop for each remaining piece and sets their parameters as follows. The process defines each specified drop's particle as the retrieved drop's particle. It also sets each specified drop's previous drop identically to the retrieved drop's previous drop (which might be null). The process also sets each specified drop's G PLF equal to the portion of the retrieved drop's G PLE for which the drop was specified. It also sets each specified drop's $\hat{F}$ PLF equal to the sum of (1) the specified drop's G PLF, and (2) the portion of the retrieved drop's $\hat{H}$ PLF with the same domain as the specified drop's G PLF. The addition of two PLF's is described in the above-incorporated applications.

At 726, the process then determines whether any drop created at 724 has a smaller index-$\hat{F}$ value than the smallest index-$\hat{F}$ value of the drops stored in the priority queue. If not, the process stores (at 728) the drops specified at 724 in the priority queue based on the index-$\hat{F}$ value of each drop. From 728, the process transitions back to 708 to select another drop. On the other hand, if the process determines (at 726) that at least one drop specified at 724 has the lowest index-$\hat{F}$ value of all the drops stored in the priority queue, the process identifies (at 730) as the Current_Drop a drop that was specified at 724 and that has the lowest index-$\hat{F}$ value. At 730, the process also stores the remaining specified drops in the priority queue based on the index-$\hat{F}$ value of each drop.

Figure 9:
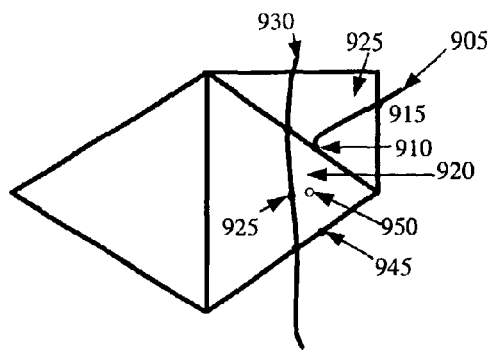

From 730, the process transitions to 732. The process also transitions to 732 from 720. At 732, the process determines whether the Current_Drop's particle is a target. If not, the process tries (at 734) to expand the path search about the Current_Drop. Specifically, at 734, the process tries to identify one or more potential expansions about the Current_Drop. Some embodiments identify potential expansions about the Current_Drop by (1) identifying a set of valid spaces to which a path can expand from the Current_Drop's particle, and (2) identifying destination particles in each identified space. A valid space is one that contains the Current_Drop's particle but does not contain the particle of the prior drop in a path search (i.e., does not contain the particle of the Current_Drop's previous drop). FIG. 9 illustrates an example of a valid expansion space for a planar expansion. This figure illustrates a path search 905 that has a last drop 910 and a second-to-last drop 915. The particles of both these drops are part of space 925. The particle of drop 910 is also part of space 920. Consequently, space 920 is a valid expansion space for drop 910, but space 925 is not. There can be multiple viable expansion spaces as a retrieved drop's particle (such as a node) can be in multiple spaces. One of ordinary skill will realize that other embodiments might identify potential expansions about the Current_Drop differently. For instance, some embodiments might define a valid space for an expansion differently. One such embodiment might not require that the Current_Drop's particle to be part of the valid space.

After the process identifies (at 734) a set of valid spaces to which the path can expand from the Current_Drop's particle, it identifies (at 734) potential destination particles in each identified space. In some embodiments, a path can expand towards exits, walls and holes, as well as the selected net's nodes, in a valid expansion space. One of ordinary skill will realize that other embodiments might specify other potential expansion particles in a valid expansion space.

In the example illustrated in FIG. 9, the path search can expand from drop 910 to exit 945, hole 950, and wall 925. Wall 925 belongs to a route 930 of another net. The path generation process 700 might allow a path expansion to the wall of another net's previously defined path because it might allow later defined routes to rip up earlier defined routes. In such cases, expanding to the walls of another net's path is assessed a penalty, as further described below.

In some situations, the process 700 cannot identify (at 734) any potential expansions to another particle. However, when the process identifies one or more potential expansions at 734, the process performs the following five operations at 734. First, it specifies the $\hat{H}$ PLF of each potential expansion's destination particle if it had not previously been set for the path search. The generation of the $\hat{H}$ PLF is described below. Second, the process specifies a G PLF for each potential expansion. The generation of the G PLF for an expansion (i.e., the costing of an expansion) is described below.

Third, for each potential expansion, it (1) defines an adjusted filter function $FPLF_A$ by subtracting epsilon from the filter function $FPLF_P$ of this drop's particle (i.e., $FPLF_A = FPLF_D - e$), and (2) filters the expansion's G PLF with the adjusted filter function $FPLF_A$. Fourth, the process specifies a drop for each convex piece (if any) of a potential expansion's G PLF that remains after the filtering operation. For each specified drop, the process (1) sets the drop's G PLF equal to the remaining piece of the filtered G PLF for which the drop was created, (2) associates the drop with its expansion's destination particle, (3) sets the drop's previous drop to the Current_Drop, and (4) sets the drop's $\hat{F}$ PLF to the sum of the drop's G PLF and the portion of its destination particle's $\hat{H}$ PLF that is defined over the domain of the drop's G PLF. The process stores each drop it creates at 734 in the priority queue.

Fifth, if any portion of the potential expansion's G PLF remains after the filtering of this PLF, the process defines a new filter function for the retrieved drop's particle from these remaining portions. Specifically, the process sets the destination particle's filter PLF $FPLF_P$ equal to the minimum of the filtered G PLF and the destination particle's current filter PLF $FPLF_P$.

From 734, the process transitions to 736. The process also transitions to 736 if it determines at 712 that no portion of a retrieved drop's G PLF remains after the filtering at 710. At 736, the process determines whether the priority queue that stores the drops is empty. If so, the process has failed to find a path between the specified source and target sets. Accordingly, it returns (at 738) a notification specifying its failure and then ends. On the other hand, when the process determines (at 736) that the priority queue is not empty, the process transitions back to 708 to retrieve the next lowest-cost drop from this priority queue and then to perform the subsequent operations for this drop.

The process has found a path between the source and target sets when it determines (at 732) that the Current_Drop's particle is a target. In this situation, the process transitions from 732 to 740. At 740, the process 700 performs a back trace operation to embed topologically the identified path between the source set and the target. Starting at the Current_Drop on the target, this operation "back traces" the sequence of drops that reached the target and generates an ordered list of topological particles that define the topological path. Generation of such an ordered list entails creation of wall particles between each pair of non-wall, non-via particles in the topological path, and can also entail the creation of joints, Steiners, and via nodes. In some embodiments, this operation also specifies coordinates for each topological particle that it creates. The back trace operation is further described in the above-incorporated application Ser. No. 10/215,896.

One of ordinary skill will realize that the Q* path-generation process might be implemented differently in other embodiments. For instance, some embodiments might utilize non-convex PLF's. Also, in some embodiments, the $\hat{H}$ cost function might not specify a lower bound on the shortest path between a drop's particle and a target set. In addition, some embodiments might compute the $\hat{F}$ function slightly differently. For instance, some embodiments might express the $\hat{F}$ function as:

$$\hat{F} = G + 2*\hat{H}.$$

Such a function would bias the search process to expand about the drops that are closer to the target set. Alternative embodiments might express the $\hat{F}$ function as:

$$\hat{F} = G + \hat{H} + \hat{J},$$

where $\hat{J}$ represents the estimated computational effort needed to complete the path from the current drop. The embodiments that use alternative $\hat{F}$ function do not satisfy the admissibility requirement (i.e., they do not produce consistently the lowest-cost path between source and target sets). On the other hand, the embodiments that use the $\hat{F}$ function of equation (1) do satisfy this requirement.

C. Computing G PLF

When the process 700 identifies (at 734) a potential expansion from the Current_Drop's particle to a destination particle, this process specifies (at 734) a G PLF for such a potential expansion. In some embodiments, the process 700 computes this G PLF by (1) propagating the Current_Drop's G PLF to the destination particle, and (2) for certain expansions, adding one or more penalty costs to the PLF resulting from the propagation.

1. Propagation

Propagating the Current_Drop's G PLF to an expansion's destination particle generates a PLF that expresses the distance and penalty costs of reaching the Current_Drop's particle plus the distance cost of reaching the expansion's particle from the Current_Drop's particle. In other words, the propagation accounts for the extra distance cost of going from the Current_Drop's particle to the expansion's particle.

Some embodiments limit each propagation operation to only the portion of the expansion's destination particle to which a path can expand from the Current_Drop. The discussion below uses the phrase "destination state" to refer to the portion of an expansion's destination particle to which a path can expand from the Current_Drop. This discussion also uses the phrases "the Current_Drop's domain" or "the start domain" to refer to the domain of the Current_Drop's G PLF.

Nine different propagation operations are described below for nine pair-wise combinations of expansions between points, line, and surfaces. In these propagation operations, points represent nodes, lines represent edge- and wall-segments to which a path can expand, and surfaces represent portions of holes to which a path can expand.

As mentioned above, a hole is specified between each pair of overlapping spaces when the intersection of the two polygons of the overlapping spaces is larger than a threshold size. Such a hole represents a potential via that can be anywhere in the polygonal intersection of the two polygons of the two overlapping spaces. In some embodiments, a path for a net can expand to each portion of a hole. These embodiments might specify the same width and spacing constraints for all nets being routed at a given time, or might construct each hole for the worst case of constraints (e.g., construct the polygons of the hole's overlapping spaces for the worst case of constraints). Alternatively, some embodiments construct each hole based on the best case of constraints (e.g., construct the polygons of the hole's overlapping spaces for the best case of constraints). For an expansion of a path of a net to a hole, these embodiments then identify a sub-set of the hole's polygon (i.e., the polygonal surface represented by the hole) to which the net's path can expand given the spacing constraints for the net. One manner for identifying the sub-set of hole polygons is described in the above-incorporated application Ser. No. 10/215,896.

a. Expansion from point to point

To perform a propagation operation for an expansion that goes from an expansion start point to an expansion destination point (e.g., goes from one node to another node), the process 700 identifies a distance cost based on the distance between the two points and adds this distance cost to the G PLF of the start point (i.e., to the Current_Drop's G PLF). As mentioned above, some embodiments use the preferred-direction octilinear wiring model. In some of these embodiments, the process identifies the distance cost between two points as the minimum of three distance costs, which are the Manhattan distance cost, the diagonal distance cost, and octilinear distance cost.

(1) Manhattan Distance Cost

The Manhattan distance cost is the distance between the two points if only Manhattan wiring could be used to connect the two points. The process 700 computes this cost by identifying the Manhattan bounding box that has the two points as two of its opposing vertices. This Manhattan bounding box has a width (W) and a height (H). The box's width is parallel to the layout's x-axis and the horizontal wiring direction, while the box's height is parallel to the layout's y-axis and the vertical wiring direction. When the two points are aligned in a horizontal or vertical direction, the Manhattan bounding box has not height or width.

After identifying the Manhattan bounding box, the process then computes the Manhattan distance cost as $(S_H^L * W) + (S_V^L * H)$, where $S_H^L$ and $S_V^L$ are scalar constants along the horizontal and vertical directions on the layer L that contains the two points.

(2) Diagonal Distance Cost

The diagonal distance cost is the distance between the two points if only ±45° wiring could be used to connect the two points. The process 700 computes this cost by identifying the 45° bounding box that has the two points as two of its opposing vertices. To identify this bounding box, the process first maps the coordinates of the two points from the layout's x- and y-coordinate axes to a 45° counterclockwise rotated s- and t- coordinate axes. The equation below provides the mathematical relationship used to perform this mapping.

$$s_1 = \frac{x_1 - y_1}{\sqrt{2}},$$

$$t_1 = \frac{x_1 + y_1}{\sqrt{2}},$$

$$s_2 = \frac{x_2 - y_2}{\sqrt{2}}, \text{ and}$$

$$t_2 = \frac{x_2 + y_2}{\sqrt{2}}.$$

In this equation, (1) $x_1$, $y_1$ and $x_2$, $y_2$ are respectively the x- and y-coordinates of the first and second points, (2) $s_1$, $t_1$ and $s_2$, $t_2$ are respectively the s- and t- coordinates of these two points.

After transforming the coordinates of the two points, the 45° bounding box can be easily specified as the two points are two opposing corners of this box. This box has a width ($W_D$) that is parallel to the s-axis and the 45° wiring direction, and a height ($H_D$) that is parallel to the t-axis and the −45° wiring direction. The size of the width $W_D^M$ is the absolute value of the difference between $S_2$ and $s_1$, while the size of the height $H_D^M$ is the absolute value of the difference between $t_2$ and $t_1$.

After identifying the 45° bounding box, the process then computes the diagonal distance cost as $(S_{45}^L * W_D^M) + (S_{-45}^L * H_D^M)$, where $S_{45}^L$ and $S_{-45}^L$ are scalar constants along the 45° and −45° directions on the layer L that contains the two points.

(3) Octilinear Distance Cost

The octilinear distance cost is a distance between the two points along a Manhattan direction and a diagonal direction. The particular Manhattan and diagonal directions can be identified from the relationship between the x- and y-coordinates of the two points. Table 1 identifies these directions for different coordinate scenarios. This table also identifies the equation to compute the octilinear

TABLE 1

| x & y Coordinates of the Two Points | Manhattan and Diagonal Direction | Octilinear Distance Cost |
|---|---|---|
| One point has smaller x- and y-coordinates, and the difference between the x-coordinates is smaller than the difference between the y-coordinates. | Vertical and 45° directions. | $[(H - W) * S_V^L] + [W * \sqrt{2} * S_{45}^L]$. |
| One point has smaller x- and y-coordinates, and the difference between the y-coordinates is smaller than the difference between the x-coordinates. | Horizontal and 45° directions. | $[(W - H) * S_H^L] + [H * \sqrt{2} * S_{45}^L]$. |

TABLE 1-continued

| x & y Coordinates of the Two Points | Manhattan and Diagonal Direction | Octilinear Distance Cost |
|---|---|---|
| The point with smaller x-coordinate has a larger y-coordinate, and the difference between the x-coordinates is smaller than the difference between the y-coordinates. | Vertical and −45° directions. | $[(H - W)*S_V^L] + [W*\sqrt{2}*S_{-45}^L]$. |
| The point with smaller x-coordinate has a larger y-coordinate, and the difference between the y-coordinates is smaller than the difference between the x-coordinates. | Horizontal and −45° directions. | $[(W - H)*S_H^L] + [H*\sqrt{2}*S_{-45}^L]$. |

In Table 1, H and W are the height and width of the Manhattan bounding box of the two points, while $S_H^L$, $S_V^L$, $S_{45}^L$ and $S_{-45}^L$ are scalar constants along the horizontal, vertical, 45°, and −45° directions on the layer L that contains the two points.

b. Expansion from point to line or point to surface

FIG. 10 illustrates a process 1000 that propagates a PLF that is defined over a point to a line or a surface. This process is described below by reference to FIG. 11, which illustrates an example of propagating a PLF from a point P to a line L, and FIG. 12, which illustrates an example of propagating a PLF from a point P to a surface S.

As show in FIG. 10, the process 1000 initially projects (at 1005) vectors in all available interconnect directions from the Current_Drop's point. These vectors are referred to below as propagation vectors. The embodiments described below utilize the above-described octilinear wiring model. Accordingly, these embodiments project vectors in the 0°, 45°, 90°, 135°, 180°, 225°, 270°, and 315° directions. FIGS. 11 and 12 illustrate eight propagation vectors emanating from their points P in 0°, 45°, 90°, 135°, 180°, 125°, 270°, and 315° directions. Some embodiments do not project vectors in all interconnect directions. Instead, they project only the propagation vectors that will intersect the destination state. These propagation vectors are the vectors that fall within a triangle defined by the start-state point and the leftmost and rightmost vertices of the destination state.

At 1010, the process then identifies the intersection of the projected propagation vectors and the destination line or surface. A propagation vector intersects with a line at a point that is the location of a knot of the destination's line PLF. FIG. 11 illustrates the intersection of the propagation vectors 1105, 1110, and 1115 at three points 1120, 1125, and 1130 along line L. A propagation vector intersects a surface either (1) at only a vertex of the surface, or (2) at two points on the surface boundary and an edge that runs through the surface. FIG. 12 illustrates the intersection of two propagation vectors 1215 and 1220 with the surface S along edges 1270 and 1275, which respectively terminate on boundary point pair 1225 and 1230 and point pair 1235 and 1240.

Next, for the expansion to the destination state, the process 1000 then specifies (at 1015) a G PLF with knots at the intersections identified at 1010. Specifically, for a destination line, the process 1000 specifies (at 1015) a knot at each point of the destination line that a propagation vector intersects. FIG. 11 illustrates a G PLF 1145 with three knots 1150, 1155, and 1160 for the three intersection points 1120, 1125, and 1130. For a destination surface, the process 1000 specifies (at 1015) a knot at each surface vertex intersected by a propagation vector and a knot at each surface boundary point intersected by a propagation vector. FIG. 12 illustrates a G PLF 1260 with four knots 1280, 1282, 1284, and 1286 that are defined for four boundary intersection points 1225, 1230, 1235, and 1240.

At 1015, the process 1000 sets the PLF-value of each knot that it specifies at 1015. The PLF-value of a knot ($P_K$) specified at 1015 equals (1) the Current_Drop's PLF-value $P_C$ plus (2) the distance cost D (according to the approach described in Section II.C.1.a) for the start point P and the knot's x,y coordinates (i.e., $P_K=P_C+D$). For example, in FIG. 11, the PLF-value of knot 1155, which is identified at the intersection 1125 of the −45° propagation vector 1110 and the line L, equals the point P's PLF-value plus the distance cost (according to the approach described in Section II.C.1.a) for the point P and the intersection point 1125. In FIG. 12, the PLF-value of knot 1286, which is identified at the intersection 1240 of the 45° propagation vector 1220 and the surface S, equals the point P's PLF-value plus the distance cost (according to the approach described in Section II.C.1.a) for the point P and the intersection point 1125.

At 1020, the process specifies knots for the expansion's G PLF at the location of any unexamined vertex of the destination state. The vertices of a destination line are its endpoints. A line endpoint is an unexamined vertex if none of the projected propagation vectors intersect the destination line at the endpoint. The PLF-value of an unexamined endpoint of a destination line equals (1) the Current_Drop's PLF-value at the start point, plus (2) the distance cost (according to the approach described in Section II.C.1.a) for the start point and the endpoint. In FIG. 11, the process specifies two knots 1165 and 1170 at the endpoints 1175 and 1180 of the line L, and specifies the PLF-value of each of these knots as the PLF-value at point P plus the distance cost (according to the approach described in Section II.C.1.a) for point P and each knot location 1175 or 1180.

The vertices of a destination surface are the vertices of the edges that define the surface's external boundary. Such a vertex is an unexamined vertex if none of the propagation vectors intersect the destination surface at the vertex. In FIG. 12, the destination surface S has five vertices 1265, all of which are "unexamined" as they are not at the intersection of the propagation vectors and the surface. Accordingly, five knots 1290 are specified at the unexamined vertices 1265. The PLF-value for each such knot equals (1) the distance cost (according to the approach described in Section II.C.1.a) for the start point and the surface's vertex that corresponds to the knot, plus (2) the Current_Drop's PLF-value at the start point. For instance, the PLF-value of knot 1290a equals the PLF-value at the start point P plus the distance cost (according to the approach described in Section II.C.1.a) for the point P and vertex 1265a.

For a destination surface, the process 1000 uses (at 1025) the knots specified at 1015 and 1020 to specify the edges and facets of the surface PLF that is defined over the destination surface. For each facet, the process defines a normal and a z-intercept. Standard plane-defining techniques can be used to derive the normal and z-intercept values of a facet from three points on the facet. For each facet, the process 1000 identified at least three knots at 1015 and 1020.

C. Line to Line or Surface to Line

FIG. 13 illustrates a process 1300 for propagating a PLF from a line to another line or from a surface to a line. This process is described by reference to FIG. 14, which illustrates the propagation of a line PLF from a line 1405 to another line 1410, and FIG. 15, which illustrates the propagation of a surface PLF from a surface 1502 to a line 1504.

As shown in FIG. 13, the process 1300 initially identifies (at 1305) the propagation vectors that emanate from the locations on the Current_Drop's domain that are locations of knots in the Current_Drop's G PLF. The identification of these propagation vectors is further described below by reference to FIGS. 16–21. In FIG. 14, knots are located at points 1415 and 1420 on line 1405. In FIG. 15, knots are located at vertices 1506–1518 of surface 1502.

Next, at 1310, the process 1300 projects the propagation vectors identified at 1305. In some embodiments, the process 1300 does not project (at 1310) vectors in all interconnect directions. Instead, it projects only the propagation vectors that will intersect the destination state. In these embodiments, this process projects propagation vectors that fall within a triangle defined by the knot-location and the leftmost and rightmost vertices of the destination line or surface.

FIG. 14 illustrates several projected propagation vectors from knot-location 1415 and 1420, while FIG. 15 illustrates several projected propagation vectors from knot-locations 1508, 1510, and 1512. As further described below, the direction of the propagation vectors that emanate from knot-locations depends on the wiring costs along different wiring directions on the layer that contains the expansion start and destination states. Accordingly, depending on the wiring costs on the layers that contain line 1405 and surface 1502, different propagation vectors might emanate from the knot-locations in FIGS. 14 and 15. The propagation vectors illustrated in FIGS. 14 and 15 are only provided to conceptually illustrate two examples for the process 1300.

After projecting propagation vectors, the process 1300 identifies (at 1315) the intersection of the destination line and the propagation vectors that were projected at 1310. FIG. 14 illustrates the intersection of the propagation vectors 1430 and 1435 and the line 1410 at points 1450 and 1455. FIG. 15 illustrates the intersection of the propagation vectors 1522, 1524, and 1526 and the line 1504 at points 1530, 1532, and 1534.

Each intersection identified at 1315 is a knot in the expansion's G PLF. Accordingly, for the expansion to the destination line, the process specifies (at 1320) a line G PLY with a knot at each intersection identified at 1315. At 1320, the process computes the PLF-value of each knot specified at 1320. To describe the computation of these PLF-values, two terms have to be defined. These terms are a wedge and a channel. Two propagation vectors that emanate from the same location on the Current_Drop's domain define a wedge. Two parallel propagation vectors that emanate from two different locations on the Current_Drop's domain define a channel.

Some embodiments compute the PLF-value at an intersection of a destination state and a propagation vector that emanates from a line or surface as follows. If the propagation vector is part of a wedge, the PLF-value of a destination-state knot ($P_K$) specified at 1315 equals (1) PLF-value $P_C$ of the Current_Drop's knot that was used to identify the destination-state knot plus (2) the distance cost D (according to the approach described in Section II.C.1.a) for the x,y coordinates of the two knots (i.e., $P_K=P_C+D$). On the other hand, if the propagation vector is only part of a channel (i.e., it is not part of any wedge), the PLF-value of a destination-state knot ($P_K$) equals (1) the PLF-value ($P_C$) of the Current_Drop's knot that was used to identify the destination-state knot, plus (2) the distance d, along the propagation vector used to identify the knot, between the x,y coordinates of the two knots, times the scalar $S_R^L$ for the propagation-vector direction on layer L containing the two knots (i.e., $P_K=P_C+d*S_R^L$).

For instance, in FIG. 14, knot 1472 is defined at the intersection 1450 of the line 1410 and the propagation vector 1430, which forms a wedge with the propagation vector 1435 at vertex 1420. Accordingly, the PLF-value of knot 1472 equals (1) the PLF-value of the Current_Drop's G PLF at point 1420 on the line 1405, plus (2) the distance cost D (according to the approach described in Section II.C.1.a) for the points 1420 and 1450. Similarly, in FIG. 15, the knot 1544 is defined at the intersection 1532 of the line 1504 and the propagation vector 1524, which forms a wedge with the propagation vector 1526 at vertex 1512. The PLF-value of knot 1544 equals (1) the PLF-value of the Current_Drop's G PLF at 1512 on the surface 1502, plus (2) the distance cost D (according to the approach described in Section II.C.1.a) for the points 1512 and 1532. On the other hand, the knot 1542 in FIG. 15 is defined at the intersection 1530 of the line 1504 and the propagation vector 1522, which is not part of any wedge. Hence, the PLF-value ($P_K$) at knot 1542 equals (1) the PLF-value ($P_C$) of the Current_Drop's G PLF at 1510 on the surface 1502, plus (2) the distance d1 (between points 1510 and 1530 along the direction of the vertical propagation vector 1522) times the vertical-direction scalar $S_V^L$ for the layer L containing the point the states 1502 and 1504 (i.e., $P_K=P_C+d1*S_V^L$).

At 1325, the process specifies knots for the expansion's G PLF at the location of unexamined vertices of the destination line, and then terminates. As mentioned above, an unexamined vertex of a destination line is an endpoint of the line that does not intersect any of the projected propagation vectors. An unexamined destination-line vertex can be in either a wedge or a channel. The PLF-value of a knot specified for an unexamined vertex that is within a wedge defined by two propagation vectors emanating from the same start-state location equals (1) the PLF-value of Current_Drop's G PLF at the start-state location, plus (2) the distance cost (according to the approach described in Section II.C.1.a) for the start-state location and the unexamined vertex.

When a knot is specified for an unexamined vertex within a channel, the process identifies the length of a line segment that is parallel to the two channel-defining vectors and that starts at the unexamined vertex and terminates at the start domain. The process then specifies this knot's PLF-value equal to (1) the identified length times the scalar constant $S_R^L$ for the channel-vector direction, plus (2) the PLF-value of the Current_Drop's G PLF at the point that the line segment terminates on the start domain. The line segment terminates on the start domain on a second line segment that is between the two knot locations from which the two channel-defining vectors emanate. When the start domain is a surface, the second line segment (1) is an edge on the boundary of the surface if the two knot locations are boundary vertices of the surface, and (2) is a line segment within the surface if the two channel-defining knot locations are within the surface.

For instance, in FIG. 14, endpoint 1445 of the line 1405 falls within a channel defined by propagation vectors 1425 and 1430. The distance between endpoint 1445 and line 1405 is the length d2 of a line segment 1440 that is parallel to vectors 1425 and 1430. Accordingly, the PLF-value of the knot 1476 specified at endpoint 1445 equals (1) the length d2 times the vertical-direction scalar constant $S_V^L$ for the layer L containing lines 1405 and 1410, plus (2) the PLF-value of the Current_Drop's G PLF at point 1480, which is the location that line segment 1440 intersects line 1405. In FIG. 14, the endpoint 1460 is within a wedge defined by two propagation vectors 1435 and 1482 that emanate from the start-state location 1420 on the line 1405. Accordingly, the PLF-value for the knot 1478 that is specified at 1460 equals (1) the PLF-value of the Current_Drop's G PLF at the start-state location 1420, plus (2) the distance cost that can be computed for points 1460 and 1420 according to approach described in Section II.C.1.a.

In FIG. 15, endpoint 1554 falls within a channel defined by propagation vectors 1520 and 1522. The distance between endpoint 1554 and surface 1502 is the length d3 of a line segment 1560 that is parallel to vectors 1520 and 1522. Accordingly, the PLF-value of the knot 1550 specified at point 1554 equals (1) the length d3 times the vertical-direction scalar $S_V^L$ for the layer L containing the states 1502 and 1504, plus (2) the PLF-value of the Current_Drop's G PLF at point 1562, which is the location that the line segment 1560 intersects the surface boundary. The endpoint 1556 in FIG. 15 is within a wedge defined by propagation vectors 1526 and 1564 that emanate from the start-state location 1512. Hence, the PLF-value for the knot 1552 specified at 1556 equals (1) the PLF-value of the Current_Drop's G PLF at the start-state location 1512, plus (2) the distance cost that is computed for points 1512 and 1556 according to the approach described in Section II.C.1.a.

FIGS. 16–21 illustrate how some embodiments identify the propagation vectors that emanate from the knot locations of a line PLF or surface PLF. These embodiments identify the propagation vectors based on the following observations. At most eight propagation-vector wedges can be defined about a Current_Drop's domain when the preferred-direction octilinear wiring model that provides horizontal, vertical, and ±45° diagonal interconnect lines on each layer is used. Knots can be the only sources for wedges.

As mentioned above, each wedge is defined by two propagation vectors that emanate from the same knot location. Two wedges are abutting wedges when they share a propagation vector, while two wedges are adjacent wedges when they have parallel propagation vectors. For instance, FIG. 16 illustrates eight wedges 1650–1664 that are defined about three knot locations 1625, 1635, and 1640 from a surface PLF's domain 1600. In this figure, there are five abutting wedge pairs, and three adjacent wedge pairs. For instance, wedges 1650 and 1652 are abutting wedges as they share vector 1666, while wedges 1656 and 1658 are adjacent wedges as their vectors 1668 and 1670 are parallel.

The parallel propagation vectors of two adjacent wedges define a freeway. For instance, a freeway 1672 exits between adjacent wedge pairs 1650 and 1664 in FIG. 16. A freeway either (1) defines a channel when no other propagation vectors emanates from a knot location that falls within the freeway, or (2) contains two or more channels when other propagation vectors that are parallel to the freeway emanate from knot location(s) that fall(s) within the freeway. Freeway 1672 includes two channels 1674 and 1676 that are defined because of the channel-defining propagation vector 1678 between the adjacent wedge pairs 1650 and 1664. At most there are eight adjacent wedge pairs about a Current_Drop's domain. Consequently, there are at most eight freeways between the adjacent wedge pairs.

Some embodiments define the direction of the propagation vectors that emanate from a Current_Drop's domain by performing the following three operations. First, they identify the knot location for each wedge. Second, these embodiments identify one or more freeways between adjacent wedge pairs. Third, for each identified freeway, these embodiments determine whether to treat the freeway as one channel, or to define additional channels within the freeway by defining one or more propagation vectors that are parallel to the freeway-defining vectors and that emanate from knot location(s) that fall within the freeway. The first operation (i.e., the identification of the knot location for each wedge) is described below by reference to FIGS. 17 and 18. The second and third operations (i.e., the identification of freeways and additional channels within the freeways) are then described by reference to FIGS. 19–21.

Figure 18:
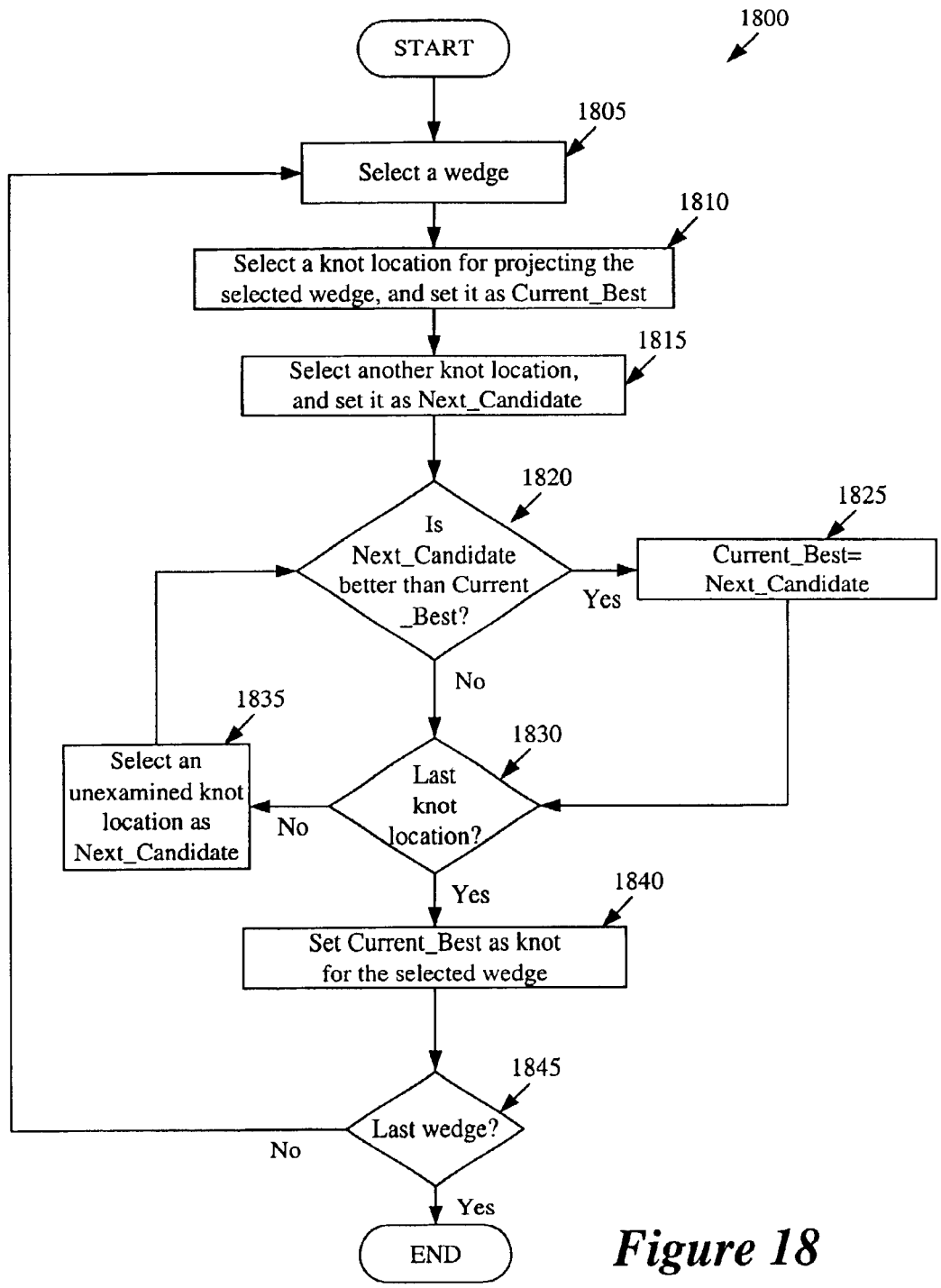

FIG. 18 illustrates a process 1800 that identifies the knot location for each propagation-vector wedge that emanates from the Current_Drop's domain, which can be a line or a surface. This process accounts for different costing of preferred and non-preferred routing directions on the layer that contains the Current_Drop's domain. The process 1800 will be described by reference to an example illustrated in FIG. 17. This example illustrates how one of the wedges of the PLF-surface domain 1600 of FIG. 16 is identified.

The process 1800 initially selects (at 1805) a wedge. There are eight wedges when the preferred-direction octilinear wiring model that specifies horizontal, vertical, and ±45° diagonal interconnect lines on each layer is used. The process then selects (at 1810) a knot location as the first candidate location for the source of the selected wedge, and records this knot location as the current best (Current_Best) location for the selected wedge. FIG. 17 illustrates a selected wedge 1652 and a first candidate knot location 1610.

Next, at 1815, the process selects a second candidate knot location for the source of the selected wedge and records it as Next_Candidate location. In FIG. 17, the second candidate location is location 1625. At 1820, the process then determines whether the Current_Best knot location is a better candidate location than the Next_Candidate location. This determination ensures that all locations in the wedge are best reached from the source of that wedge, when both distance and PLF-value is considered.

To make this determination, the process performs the following three operations. First, the process computes the dot product of the selected wedge's "vector" W and a candidate vector C that starts from Current_Best knot location and terminates on Next_Candidate knot location. When the two propagation vectors Q and T that define the wedge are along two directions that are equally costed on the layer L, the wedge vector W bisects the wedge (i.e., is midway between the two wedge-defining vectors Q and T). Otherwise, the wedge vector W can be at any angle within the wedge. FIG. 17 illustrates a wedge vector W of the selected wedge 1652, and a candidate vector C from the Current_Best location 1610 to the Next_Candidate location 1625.

The computation of the dot product quantifies whether the Next_Candidate knot location is closer to an arbitrary point in the wedge than the Current_Best knot location. This computation accounts for preferred and non-preferred direction costing (i.e., scalar costing constants $S_H^L$, $S_V^L$, $S_{-45}^L$, or $S_{45}^L$) of the layer L that contains the expansion's start and destination states. Specifically, given that the wedge vector is not along a preferred or non-preferred wiring direction on the layer L, some embodiments obtain the dot product by identifying the related projection of the candidate vector C onto the two vectors Q and T that define the wedge. Specifically, these embodiments decompose the candidate vector C onto the wedge-defining vectors Q and T, in order to identify the distances $d_Q$ and $d_T$ along the vectors Q and T that need to be traversed to connect the start and end of the candidate vector C. The sum of these two distances is then the result of the dot product.

These two distances can be identified by solving the following two equations:

$$C_x = Q_x * d_Q + T_x * d_T, \text{ and}$$

$$C_y = Q_y * d_Q + T_y * d_T,$$

where $C_x$, $Q_x$, and $T_x$, are the components of the C, Q, and T vectors along the layout's x-axis, while $C_y$, $Q_y$, and $T_y$ are the components of the C, Q, and T vectors along the layout's y-axis. On layer L, the x- and y-components of the wedge-defining vectors Q and T depend on the scalar-costing constants of the layer L in their directions. This is because on layer L, the wedge-defining vectors can be expressed as:

$$Q^L = \frac{u_Q}{S_Q^L},$$

$$T^L = \frac{u_T}{S_T^L},$$

where $Q^L$ and $T^L$ are expressions that represent that the Q and T vectors are being considered on layer L, $u_Q$ and $U_T$ are unit vectors along the direction of vectors Q and T, and $S_Q^L$ and $S_T^L$ are the scalar-costing constants for the directions Q and T on layer L. As the magnitude of the vectors Q and T on layer L depends on the scalar-costing constants of the layer L for the directions of these vectors, then the projection of the Q and T vectors onto the x- and y-axis (i.e., the components of these two vectors along the x- and y-axes) will also depend on these scalar-costing constants of the layer L.

Second, after computing the dot product, the process computes a Cost_Delta, which is the difference in the PLF-values of Next_Candidate location and the Current_Best location according to the Current_Drop's G PLF (Cost_Delta=G PLF(Next_Candidate)–G PLF(Current_Best)). For the example in FIG. 17, the Cost_Delta is the difference in the PLF-values at locations 1625 and 1610.

Third, the process determines whether the computed dot product is greater than the Cost_Delta. If not, the Current_Best location is better than the Next_Candidate location, and the process transitions from 1820 to 1830, which is further described below. If so, the Next_Candidate location is a better location for the wedge than Current_Best location, and the process transitions from 1820 to 1825. At 1825, the process sets the Current_Best location equal to the Next_Candidate location, and then transitions to 1830. At 1830, the process determines whether it has examined all knot locations for the wedge selected at 1805. If not, the process selects (at 1835) another knot location, sets this knot location as the Next_Candidate, and transitions to 1820 to compare this newly selected Next_Candidate with the Current_Best.

When the process determines at 1830 that it has examined all the locations of knots in the Current_Drop's G PLF, the process defines (at 1840) Current_Best as the knot location for the selected wedge. The process then determines (at 1845) whether it has examined all the wedges. If not, it returns to 1805 to select another wedge and to repeat its operations for this wedge. Otherwise, it ends.

After identifying the locations of the wedges, the Qe* engine has to specify the channels between the wedges. When two wedges abut (i.e., when they share a propagation vector), no channel can exist between the wedges. However, when two wedges are adjacent wedges (i.e., when they have parallel propagation vectors) one or more channels can be defined in the freeway defined by the parallel vectors of the adjacent wedge pairs.

If the Current_Drop's domain is a line, the Qe* engine examines each adjacent wedge pair that is defined along the line. If no knot location exists on the line segment between the adjacent wedge pair, then the Qe* engine defines the freeway between the adjacent wedge pair as a channel. If one or more knot locations exist on the line segment between an adjacent wedge pair, the Qe* engine examines each knot location to determine whether they are sources of propagation vectors. The engine initially sorts in descending order the PLF-values of the knot locations between the adjacent wedge pair. If there is only one knot location between the adjacent wedge pair, the engine simply adds this PLF-value to its sorted list. The engine then selects the largest PLF-value on the sorted list. The Qe* engine then identifies the channel that contains the knot location corresponding to the selected PLF-value. This channel is the freeway formed by the adjacent wedge pair when the knot location is the first location between the wedge pair that is examined. When the knot location is not the first location between the wedge pair, the channel might be formed by one or two propagation vectors that the engine specified for knot locations (between the wedge pair) that it previously examined.

The engine next determines whether the selected PLF-value for the knot location is less than the PLF-value that can be obtained by linearly interpolating between the values at the knot locations of the vectors that define the channel that contains the selected PLF-value's knot location (i.e., determines if the selected value is below a line that connects the PLF-values at the knot locations from which the identified-channel's vectors emanate). If so, the engine specifies a channel-defining vector at the knot location associated with the selected PLF-value. This specified vector is parallel to the parallel vectors of the adjacent wedge pair.

FIG. 19 illustrates an example of a knot location 1930 that is between two adjacent wedge pairs (where one pair is formed by wedges 1910 and 1915 and one pair is formed by wedges 1920 and 1925). This knot location is examined for each of these adjacent wedge pairs. When the engine examines location 1930 for adjacent wedges 1910 and 1915, it determines whether the PLF-value of this location is smaller than the PLF-value that can be obtained for this location by linearly interpolating between the PLF-values at knot locations 1945 and 1950 that serves as the emanating location of the wedges 1910 and 1915. In FIG. 19, it is assumed that the PLF-value of location 1930 is less than the PLF-value that can be obtained through the linear interpolation. Accordingly, two propagation vectors 1935 and 1940 are defined for the knot location 1930. The propagation vector 1935 is parallel to the parallel vectors of adjacent wedges 1910 and 1915, while the propagation vector 1940 is parallel to the parallel vectors of adjacent wedges 1920 and 1925.

Figure 20:
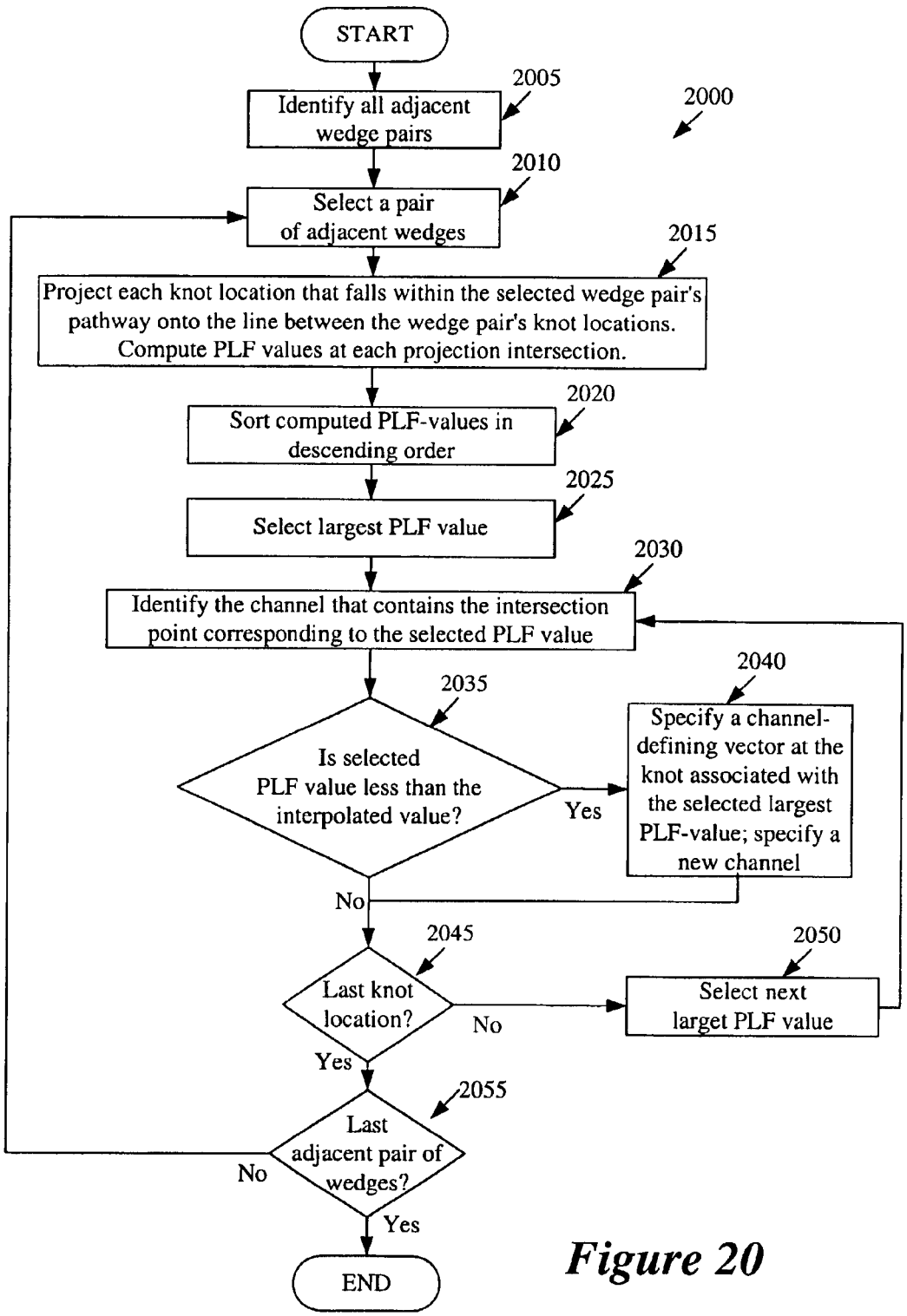

FIG. 20 illustrates a process 2000 for defining channels between adjacent wedge pairs when the Current_Drop's domain is a surface. This process will be described by reference to FIG. 21A, which illustrates the domain 2100 of a surface PLF. The process 2000 initially identifies (at 2005) all adjacent wedge pairs. It then selects (at 2010) one of the adjacent wedge pairs. In FIG. 21A, the selected pair of adjacent wedges are wedges 2105 and 2110.

Next, at 2015, the process projects each location of a knot (in the Current_Drop's G PLF), which falls within the freeway that the selected wedge pair defines, towards a line that connects the knot locations from which the wedge pair emanates. The projection is in a direction that is parallel to the adjacent-wedge-pair vectors that define the freeway. In FIG. 21A, knot locations 2120, 2125, 2130, 2135, 2140, and 2142 fall within the freeway 2115 between the adjacent wedges 2105 and 2110. Also, the two wedges emanate from knot locations 2145 and 2150, and an edge 2170 exists between these two locations. Knot location 2120 lies on the edge 2170, and hence does not need to be projected towards this line segment. On the other hand, knot locations 2125, 2130, 2135, 2140, and 2142 need to be projected towards this line segment in the direction of the vectors 2155 and 2160 that define the freeway 2115. FIG. 21A illustrates the projection of knot location 2125 towards this edge.

At 2015, the process then computes a cost at the intersection of each projection with the line. The cost at an intersection point that is identified by projecting a knot location in a routing direction R towards the line equals the sum of (1) the PLF-value $P_1$ of the G PLF at the intersection point, plus (2) the scalar constant $S_R^L$ for the routing direction R times the distance d between the projected knot location and the intersection of the knot-location's projection and the line (i.e., the cost equals $P_1 + d^* S_R^L$).

In FIG. 21A, the intersection of the projection of knot location 2125 is point 2165 on the edge 2150. Its computed cost equals (1) the value of the G PLF at the point 2165 plus (2) the scalar-costing constant $S_{-45}^L$ times the distance d between knot location 2125 and point 2165. The distance d between a projected knot location and the intersection of its projection and the line might be a positive or a negative value depending on position of the knot location with respect to the line that connects the knot locations from which the adjacent wedge pair emanates. For instance, FIG. 21B illustrates an edge 2175 within the domain 2180 of a surface PLF. This edge connects to adjacent wedge pair 2182 and 2184. FIG. 21B also illustrates two knot locations 2186 and 2188 that fall within the freeway 2190 (defined by the wedge pair 2182 and 2184) on opposing sides of the edge 2175. The distance d1 between knot location 2186 and this knot's projection point 2192 on the edge 2175 is positive, but the distance d2 between the knot location 2188 and this knot's projection point 2194 on the edge 2175 is negative. The distance d2 is negative because the knot location 2188 is on the side of the edge 2175 that is in the direction of the freeway-defining wedge vectors.

At 2020, the process sorts the computed PLF-values in descending order. It then selects (at 2025) the largest PLF-value on the sorted list. The process then identifies (at 2030) the channel that contains the intersection point corresponding to the PLF-value selected at 2025. This channel is the freeway that the adjacent wedge pair selected at 2010 defines at the first iteration through 2030 for the selected wedge pair. In the subsequent iterations through 2030, the propagation vectors that the process 2000 might identify for the knot locations between the adjacent wedge pair might define this channel partially or completely.

After 2030, the process determines whether the selected PLF-value for the intersection point is less than the PLF-value that can be obtained by linearly interpolating between the values at the two knot locations of the vectors that define the channel that contains the intersection point (i.e., determines if the selected value is below a line that connects the PLF-values at the knot locations of the identified-channel's vectors). For instance, in FIG. 21A, the process 2100 has the PLF-value at the knot locations 2145 and 2150. From these two PLF-values the process can linearly interpolate the value of any point on the line 2150 between these two locations. Accordingly, if the first selected PLF-value is the PLF-value at the intersection point 2165 for the knot location 2125, the process determines (at 2130) whether the cost computed for this knot location's projection onto point 2165 is less than the value that can be obtained for this point by linearly interpolating between the values specified at knot locations 2145 and 2150.

If the process determines (at 2135) that the selected PLF value is not less than the value that can be obtained through the linear interpolation, the process transitions to 2045, which is further described below. Otherwise, the process specifies (at 2040) a channel-defining vector at the knot location associated with the selected PLF-value. This specified vector is parallel to the parallel vectors of the adjacent wedge pair. From 2040, the process transitions to 2045.

At 2045, the process determines whether it has examined all the knot locations that fall within the freeway defined by the adjacent wedge pair. If not, the process selects (at 2050) the next largest PLF-value in the sorted list that it created at 2020. The process then performs 2030 and 2035 for the intersection point that corresponds to the PLF-value selected at 2050. As mentioned above, the first iteration through 2030 identifies the freeway as the channel that contains the intersection point corresponding to the PLF-value selected at 2025. However, a subsequent iteration through 2030 from 2050 might identify a different channel that contains the intersection point corresponding to the PLF-value selected at 2050. This is because, if the process iterates through 2040 one or more times, it defines more propagation vectors that break the freeway into smaller and smaller channels. When the process 2000 identifies (at 2030) a smaller channel (i.e., a channel that covers only a portion of the freeway) that contains the intersection point corresponding to the selected PLF-value, it derives (at 2035) the interpolated value based on PLF-value of the knot locations from which the vectors that define the channel emanate.

When the process determines at 2045 that it has examined all the knot locations that fall within the selected wedge pair's freeway, the process determines (at 2055) whether it has examined all the adjacent wedge pairs. If not, the process transitions back to 2010 to select an unexamined wedge pair. Otherwise, the process terminates.

d. Line to Surface

Figure 22:
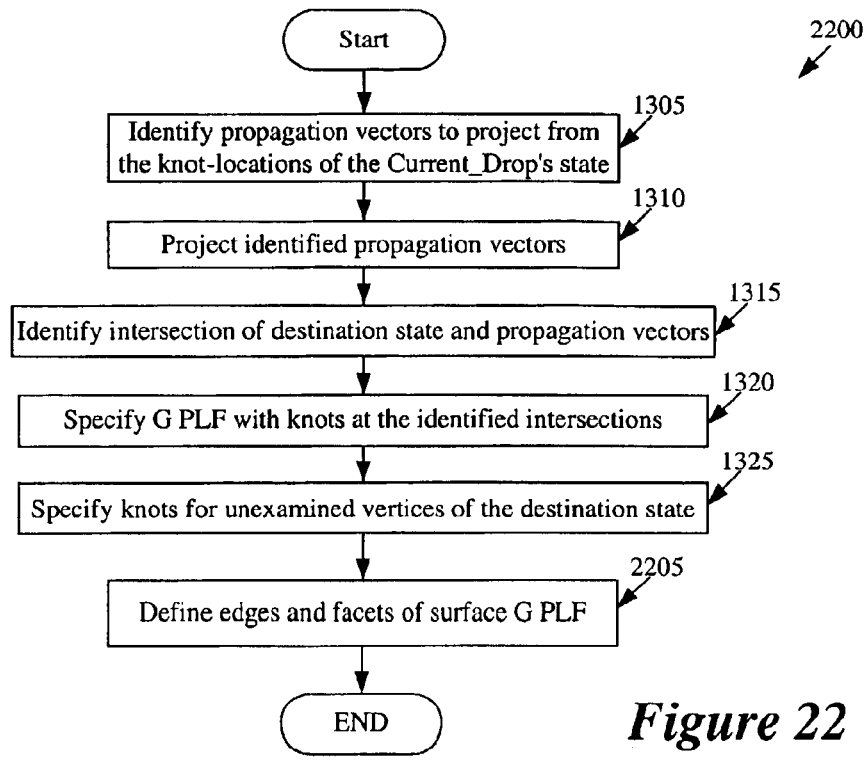
FIG. 22 illustrates a process for propagating a G PLF from a line to a surface.

FIG. 22 illustrates a process 2200 for propagating a G PLF from a line to a surface. The process 2200 is quite similar to the process 1300 of FIG. 13. Accordingly, similar reference numbers are used for similar operations of the two processes. The process 2200 has only a few minor differences with the process 1300. Propagating a PLF to a surface results in a surface PLF. Hence, after 1325, the process 2200 uses (at 2205) the attributes of the knots that it specifies to define edges and facets of a surface PLF, and to define the normal and z-intercept values of the facets.

Also, in process 2200, a propagation vector intersects the destination surface either at only a vertex or along an edge that runs through the surface and connects two points on the boundary of the surface. For the case where the propagation vector intersects the surface only at a vertex, the process 2200 would specify (at 1320) a knot at the vertex's x,y coordinates. For the case where the propagation vector runs through the surface, the process 2200 would specify (at 1320) two knots at the surface boundary points where the propagation vector intersects the surface boundary.

Figure 23:
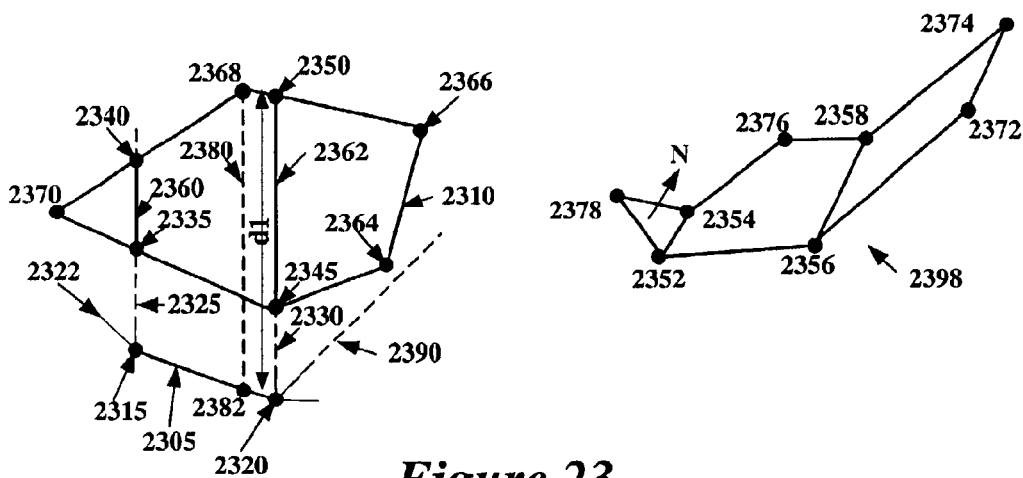
FIG. 23 illustrates an example for propagating a G PLF from a line to a surface.

FIG. 23 presents an example that illustrates the propagation of a G PLF from a line 2305 to a surface 2310. For such a propagation, the process 2200 would initially identify (at 2305) the propagation vectors that emanate from the locations on the Current_Drop's line that are locations of knots in the Current_Drop's G PLF. These propagation vectors are identified based on the approach described above by reference to FIGS. 16–21. In FIG. 23, the knots are located at points 2315 and 2320 on line 2305. From each of these points, several propagation vectors are projected. From these points, some embodiments would project only the propagation vectors that would intersect the destination surface, as mentioned above.

Next, at 1310 and 1315, the process 2200 projects the propagation vectors identified at 1305, and identifies their intersections with the destination surface. In FIG. 23, the propagation vectors 2325 and 2330 that emanate from points 2315 and 2320 intersect the destination surface along edges 2360 and 2362, which respectively terminate on boundary point pair 2335 and 2340 and point pair 2345 and 2350.

The process 2200 then starts to specify (at 1320) a G PLF that is defined over the destination surface. Specifically, at 1320, the process specifies a knot at each intersection of the propagation vectors and the boundary of the destination surface. Some embodiments compute the PLF-value at an intersection of a destination surface and a propagation vector that emanates from a line as follows. If the propagation vector is part of a wedge, the PLF-value of a destination-surface knot ($P_K$) specified at 1315 equals (1) PLF-value $P_C$ of the Current_Drop's knot that was used to identify the destination-state knot plus (2) the distance cost D (according to the approach described in Section II.C.1.a) for the x,y coordinates of the two knots (i.e., $P_K=P_C+D$). On the other hand, if the propagation vector is only part of a channel (i.e., it is not part of any wedge), the PLF-value of a destination-state knot ($P_K$) equals (1) the PLF-value ($P_C$) of the Current_Drop's knot that was used to identify the destination-state knot, plus (2) the distance d (along the propagation vector used to identify the knot) between the x,y coordinates of the two knots, times the scalar $S_R^L$ for the propagation-vector direction on layer L containing the two knots (i.e., $P_K=P_C+d*S_R^L$).

In FIG. 23, the process starts to specify a surface PLF 2398 by specifying four knots 2352, 2354, 2356, and 2358 at the identified intersections 2335, 2340, 2345, and 2350. Each of these intersections is identified by using a propagation vector of a wedge. Hence, in this example, the PLF-value of a specified destination-state knot ($P_K$) at a vector intersection equals (1) the PLF-value ($P_C$) of the start knot that was used to identify the destination knot, plus (2) the distance cost D (according to the approach described in Section II.C.1.a) for the x,y coordinates the start and destination knots. For instance, the PLF-value of knot 2354 that is specified for the location 2340 equals (1) the PLF-value of the Current_Drop's G PLF at 2315 plus (2) the distance cost D (according to the approach described in Section II.C.1.a) for the points 2315 and 2340.

At 1325, the process 2200 then specifies knots for the destination's PLF at the location of the unexamined vertices of the destination. In FIG. 23, the unexamined vertices of the destination surface are vertices 2364, 2366, 2368, and 2370. For these vertices, the process 2200 specifies knots 2372, 2374, 2376, and 2378. The PLF-value of each of these knots is computed based on whether the knot's corresponding destination-surface vertex falls within a propagation-vector wedge or channel. For instance, the unexamined vertex 2370 falls within a wedge defined by two propagation vectors 2325 and 2322 that project from 2315. Accordingly, the PLF-value of knot 2378 at vertex 2370 equals (1) the PLF-value of the Current_Drop's G PLF at point 2315, plus (2) the distance cost D (according to the approach described in Section II.C.1.a) for points 2315 and 2370. On the other hand, the unexamined vertex 2368 falls within a channel defined by two parallel propagation vectors 2325 and 2330 that project from two different points 2315 and 2320. The distance between the vertex 2368 and the line 2305 is the length d1 of a line segment 2380 that is parallel to vectors 2325 and 2330. This line segment intersects line 2305 at 2382. Hence, the PLF-value of knot 2376 at vertex 2368 equals (1) the Cunrent_Drop's G PLF-value at 2382, plus (2) the length d1 times the vertical-direction scalar constant $S_V^L$.

After 1325, the process 2200 uses (at 2205) the knots specified at 1320 and 1325 to specify the edges and facets of the surface PLF that is defined over the destination surface. For each facet, the process defines a normal and a z-intercept. FIG. 23 illustrates three facets and ten edges that define these three facets.

e. Surface to Point or Line to Point

Figure 24:
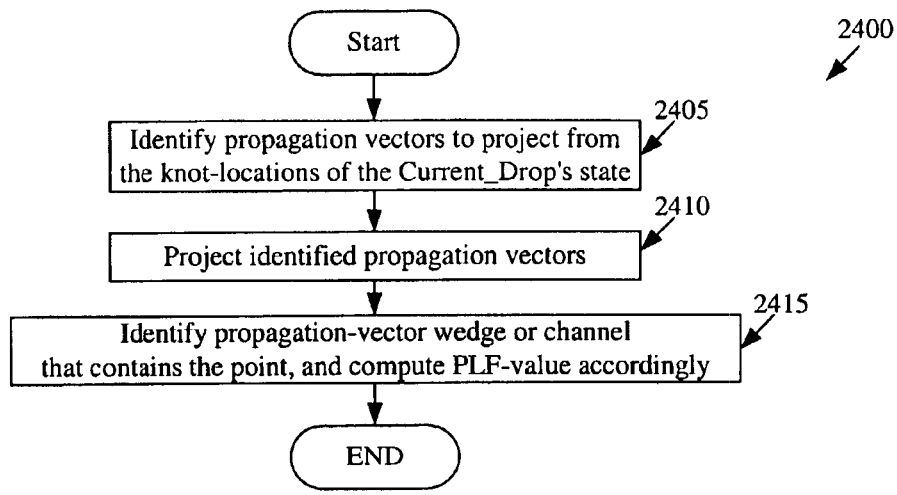
FIG. 24 illustrates a process for propagating a PLF from a line to a point or from a surface to a point.

FIG. 24 illustrates a process 2400 for propagating a PLF from a line to a point or from a surface to a point. This process is described by reference to FIG. 25, which illustrates the propagation of a line PLF from a line 2505 to a point 2520, and FIG. 26, which illustrates the propagation of a surface PLF from a surface 2602 to a point 2620.

Figure 25:
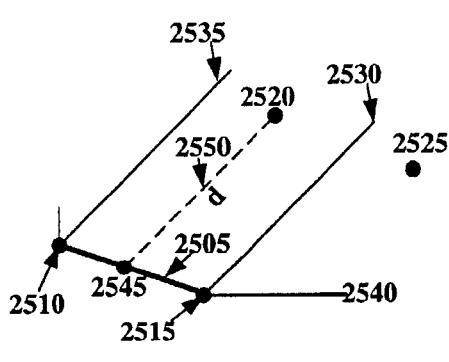
FIGS. 25 and 26 describe the process of FIG. 24.
Figure 26:
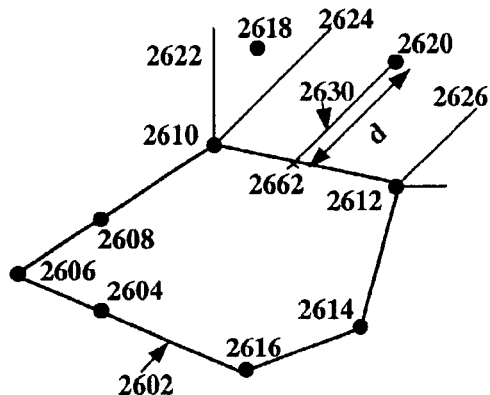

As shown in FIG. 24, the process 2400 initially identifies (at 2405) the propagation vectors that emanate from the locations on the Current_Drop's domain that are locations of knots in the Current_Drop's G PLF. The identification of these propagation vectors was described above by reference to FIGS. 16–21. In FIG. 25, knots are located at points 2510 and 2515 on line 2505. In FIG. 26, knots are located at vertices 2604–2616 of surface 2602.

Next, at 2410, the process 2400 projects the propagation vectors identified at 2405. FIGS. 25 and 26 illustrate the projection of several propagation vectors from knot-location 2510, 2515, 2610, and 2612. The process 2400 then identifies (at 2415) the propagation-vector wedge or channel that contains the destination point.

After identifying the wedge or channel in which the destination point falls, the process computes (at 2415) the PLF-value at the destination point. The PLF-value at the destination point that is within a wedge equals (1) the PLF-value of Current_Drop's G PLF at the start domain vertex from which the wedge's propagation vectors emanate, plus (2) the distance cost (according to the approach described in Section II.C.1.a) for this vertex and the destination point. On the other hand, the PLF-value at a destination point that is within a channel equals the sum of two values. One value is the scalar-costing constant $S_R^L$ for the direction R of the channel-defining vectors on the layer L containing the start and destination states, times the length of a line segment that is parallel to the two channel-defining vectors and that starts at the destination point and terminates at the start domain. The other value is the PLF-value of the Current_Drop's G PLF at the point that the line segment terminates on the start domain. The line segment terminates on the start domain on a second line segment that is between the two knot locations from which the two channel-defining vectors emanate. When the start domain is a surface, the second line segment (1) is an edge on the boundary of the surface if the two knot locations are boundary vertices of the surface, and (2) is a line segment within the surface if the two channel-defining knot locations are within the surface.

In FIG. 25, the destination point 2520 falls within a channel defined by two propagation vectors 2530 and 2535. The distance between the destination point 2520 and line 2505 is the length d of a line segment 2550 that is parallel to vectors 2530 and 2535. Accordingly, the PLF-value at destination point 2520 equals layer L's 45°-direction scalar costing constant $S_{45}^L$ times the length d plus the PLF-value of the Current_Drop's G PLF at point 2545, which is the location that line segment 2550 intersects line 2505. If the destination point was point 2525 that is within the wedge defined by propagation vectors 2530 and 2540, the PLF-value at point 2525 would be (1) the PLF-value of the Current_Drop's G PLF at point 2515, plus (2) the distance cost (according to the approach described in Section II.C.1.a) for points 2515 and 2525.

In FIG. 26, the destination point 2620 falls within a channel defined by two propagation vectors 2624 and 2626. The distance between the destination point 2620 and surface 2602 is the length d of a line segment 2630 that is parallel to vectors 2624 and 2626. Accordingly, the PLF-value at destination point 2620 equals layer L's 45°-direction scalar costing constant $S_{45}^L$ times the length d plus the PLF-value of the Current_Drop's G PLF at point 2662, which is the location that line segment 2630 intersects surface 2602. If the destination point was point 2618 that is within the wedge defined by propagation vectors 2622 and 2624, the PLF-value at point 2618 would be (1) the PLF-value of the Current_Drop's G PLF at point 2610, plus (2) the distance cost (according to the approach described in Section II.C.1.a) for points 2610 and 2618.

After 2415, the process 2400 terminates.

f. Expansion from Surface to Surface

A G PLF is propagated from a surface to another surface when, for example, the expansion is from one hole to another hole. In the embodiments described below, such an expansion would define a topologically stacked via, which is a topologically defined via that would start and end on two non-adjacent layers. A topologically defined stacked via does not always result in a geometrically stacked via. Some embodiments do not allow expansion from one surface to another as they do not allow stacked vias. Other embodiments allow such expansion, and compute the G PLF of the expansion to a destination surface from a start surface in accordance to the technique described in the above-incorporated applications.

2. Penalty Cost

Propagating the Current_Drop's G PLF to a potential destination particle specifies an initial G PLF for a potential expansion. If the potential expansion needs to be penalized, the process 700 adds to the initial G PLF one or more penalty costs associated with the potential expansion. Some embodiments penalize expansions to holes, expansions to overcongested edges and expansions to walls of other nets. Assessing penalty costs for such expansions is described in the above-incorporated patent application Ser. No. 10/215,923. In addition to these penalty costs, some embodiments might also penalize expansions that shove previously defined routes of other nets along edges or within faces. The above-incorporated application Ser. No. 10/215,923 describes several techniques for computing shoving costs in a path search that is based on a non-preferred-direction wiring model. Some embodiments of the process 700 use modifications of these shoving-cost techniques that are modified to account for the preferred-direction wiring model that the process 700 uses.

D. Computing the Ĥ PLF

In some embodiments, the process 700 specifies the Ĥ PLF of a particle as the lower-bound distance between the particle and a bounding octagon that encompasses the set of target particles for a path search.

1. Identifying Two Hounding Boxes

Some embodiments identify such a lower-bound distance by (1) identifying an axis-aligned rectangular box (i.e., a box that is aligned with the x-y coordinate axes of the layout) and a 45° rotated rectangular box (i.e., a box that is aligned with an s-t coordinate axes that is rotated by 45° with respect to the layout's x-y axes) that enclose the set of target particles, (2) identifying two PLF's that express the distance between the particle and each of these boxes, and then (3) defining the Ĥ PLF as the maximum of the two identified PLF's. The above-incorporated patent application Ser. No. 10/215,923 describes how some embodiments identify axis-aligned and 45° rotated bounding boxes.

In some embodiments, the process 700 computes a PLF that represents the distance between a particle and a bounding box in an analogous manner to the propagating of a zero-cost function that is defined over the bounding box to the particle. Accordingly, some embodiments use the above-described propagation-vector approach to compute the distance PLF between a particle and a bounding box. Specifically, these embodiments first identify propagation vectors about the bounding box. For a propagation of a zero-cost function from the bounding box, the propagation vectors can only emanate from the vertices of the bounding box.

Hence, some embodiments use the above-described wedge- and channel-identification processes 1800 and 2000 to identify propagation vectors at the vertices of the bounding box. For these operations, these embodiments use the minimum scalar-costing constants in each direction. For instance, they use $S_H^{min}$, $S_V^{min}$, $S_{-45}^{min}$, or $S_{45}^{min}$ for the preferred-direction octilinear wiring model, where $S_H^{min} = \text{Min}(S_H^1, S_H^2, S_H^3, S_H^4, S_H^5)$, $S_V^{min} = \text{Min}(S_V^1, S_V^2, S_V^3, S_V^4, S_V^5)$, $S_{45}^{min} = \text{Min}(S_{45}^1, S_{45}^2, S_{45}^3, S_{45}^4, S_{45}^5)$, $S_{-45}^{min} = \text{Min}(S_{-45}^1, S_{-45}^2, S_{-45}^3, S_{-45}^4, S_{-45}^5)$.

Some embodiments consider the minimum constant values because they do not associate the bounding box with a particular layer. They construct the bounding box based only on the x- and y-coordinates. Hence, they analyze the distance function to the bounding box only in terms of two-dimensional distance to the bounding box for the lowest scalar-costing constants.

After identifying the location of the propagation vectors about the bounding box, some embodiments project the propagation vectors and then identify the distance function based on the projected vectors. Some embodiments do not project all the vectors, but instead only project vectors that will be necessary for identifying the distance functions.

To identify the distance function based on the projected vectors, some embodiments use a modification of the wedge and channel distance rules described above. The modification entails using the minimum scalar-costing constants $S_H^{min}$, $S_V^{min}$, $S_{-45}^{min}$, or $S_{45}^{min}$, which were mentioned above. Again, some embodiments use these minimum scalar values since their bounding-box analysis is not associated with any particular layer, but rather is performed as a two-dimensional distance computation.

Figure 27:
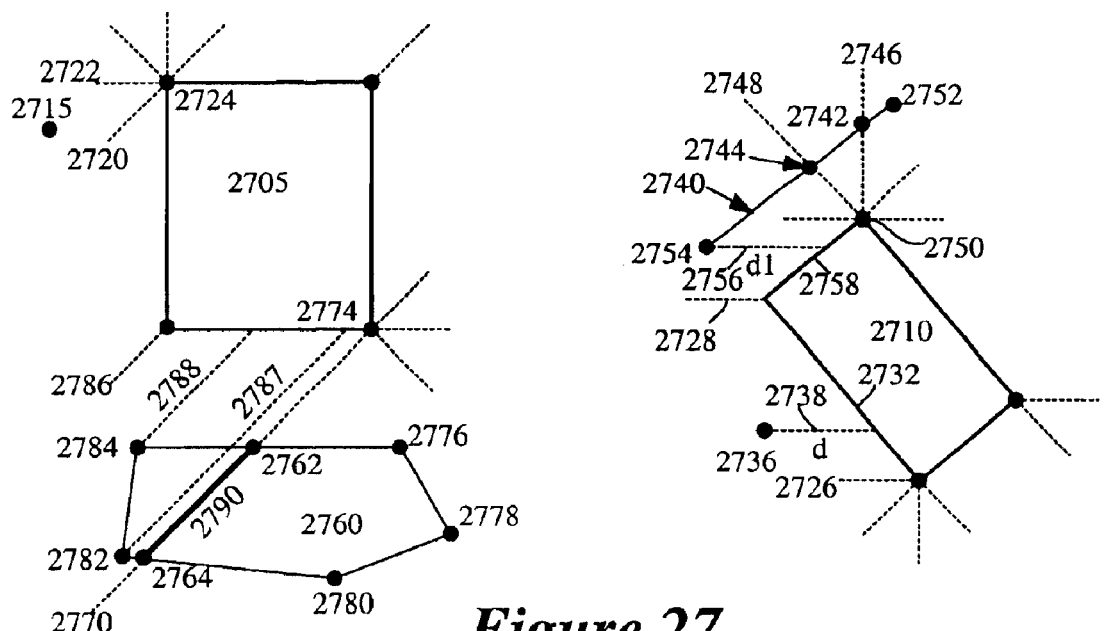
FIGS. 27 and 28 illustrate how some embodiments compute an estimated distance function.

FIG. 27 presents several examples that illustrate how the distance function is computed for point, line, and surface particles. This figure illustrates two bounding boxes 2705 and 2710, and several propagation vectors emanating from the vertices of each bounding box. When the topological particle is a point, the Ĥ PLF is a single value that is defined for the point. For instance, in FIG. 27, the point 2715 falls within a wedge defined by vectors 2720 and 2722 that emanate from vertex 2724. The Ĥ PLF of the point 2715 is the distance cost for the points 2715 and 2724, where this distance cost is computed based on the approach described in Section II.C.1.a but with the minimum scalar-costing constants mentioned above (i.e., the minimum scalar-costing constants are used in performing the calculations of the approach of Section II.C.1.a). On the other hand, the particle is point 2736 that falls within the channel defined by vectors 2726 and 2728 that emanate from different vertices of the rotated box 2710. Hence, the Ĥ PLF-value of point 2736 equals the minimum horizontal scalar-costing constant $S_H^{min}$ times length d of a line 2738, which is parallel to vectors 2726 and 2728 and that goes from the point 2736 to the edge 2732. In other words, the Ĥ PLF-value in this ease equals $d * S_H^{min}$.

When the particle is line 2740, two knots are specified at the intersections 2742 and 2744 of the projection vectors 2746 and 2748 with the line. The PLF-value of the knot at location 2742 is the distance cost for points 2742 and 2750, where this cost is computed based on the approach described in Section II.C.1.a but with the minimum scalar-costing constants mentioned above. The PLF-value of the knot at location 2744 is similarly computed. Two knots are also specified at the endpoints 2752 and 2754 of the line 2750. The endpoint at 2752 falls within a wedge. Hence, the PLF-value of the knot specified at 2752 is the distance cost for points 2750 and 2752, where this cost is computed based on the approach described in Section II.C.1.a but with the minimum scalar-costing constants mentioned above. The endpoint 2754, on the other hand, falls in a channel. Accordingly, its PLF-value is the minimum horizontal scalar-costing constant $S_H^{min}$ times length d1 of the horizontal line segment between the point 2754 and edge 2758.

When the particle is a surface 2760 and the bounding box is box 2705, two knots are specified at the intersection 2762 and 2764 of the projection vector 2770 with the surface. The PLF-value of each of these knots is the distance cost (according the approach described in Section II.C.1.a but with the minimum scalar-costing constants mentioned above) between the knot's location and the vertex that was used to define the knot. In this example, five other knots are specified at the unexamined vertices 2776, 2778, 2780, 2782, and 2784 of the surface. Of these vertices, vertices 2784 and 2782 fall within a channel defined by vectors 2770 and 2786. Accordingly, the PLF-value of each of these knots is minimum 45° scalar-costing constant $S_{45}^{min}$ times the length of the line segment (segment 2788 for knot 2784 and 2787 for knot 2782), which is parallel to vectors 2770 and 2786 and starts from the knot's location and terminates on the bounding box 2705. The PLF-value of the knot defined at each of the other three unexamined vertices (2776, 2778, and 2780) is the distance cost for the knot's location and the bounding box vertex 2774, where this cost is computed based on the approach described in Section II.C.1.a but with the minimum scalar-costing constants mentioned above.

The Ĥ PLF that is defined over the surface 2760 will have eight edges. Seven of these edges will be defined about the boundary of the surface. One edges 2790 will be defined across the surface. This edge in conjunction with the other seven boundary edges define two facets. The normal and z-intercept of each facet can be derived from the PLF-values of the knots that define the facet, by using standard plane-defining techniques.

After defining the Ĥ PLF's for the two bounding boxes, some embodiments identify the maximum of the two PLF's. Obtaining the maximum of two PLF's is analogous to obtaining the minimum of two PLF's, except that the portions that are discarded are the portions with the smaller PLF-values. Accordingly, the processes for computing the maximum of two line PLF's or two surface PLF's are analogous to the above-incorporated application's processes for computing the minimum of such PLF's, except that the processes for computing the maximum retain the line segments or surface pieces that have the larger PLF-values.

2. Different Computation of the Ĥ PLF

Figure 28:
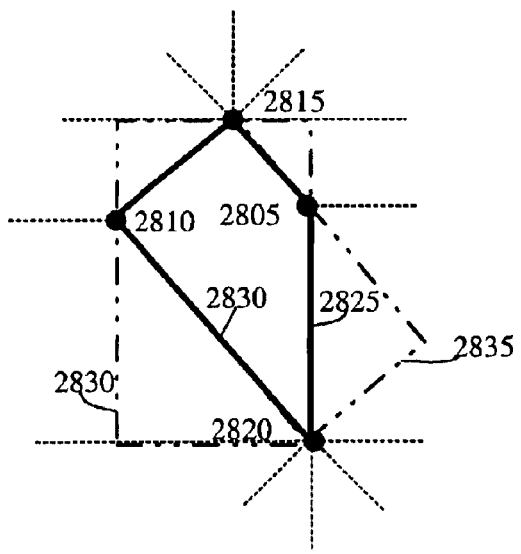

Some embodiments specify the Ĥ PLF of a particle slightly differently. These embodiments first identify a bounding polygon by identifying and intersecting two bounding rectangular boxes that enclose the set of target particles. In some of these embodiments, one box is aligned with the x-y coordinate axes of the layout while the other box is aligned with a coordinate axes that is 45° rotated with respect to the layout's x-y axes. FIG. 28 illustrates an example of an octilinear-bounding polygon 2825 that is identified by intersecting an axis-aligned box 2830 and a 45° rotated box 2835.

After identifying such an octilinear bounding polygon, these embodiments use the above-described wedge- and channel-identification processes 1800 and 2000 to identify propagation vectors at the vertices of the bounding box. For these operations, these embodiments use the minimum scalar-costing constants in each direction, like the embodiments described above in Section II.D.1.

These embodiments then use the identified propagation vectors to identify an Ĥ PLF that expresses the distance between the particle and the octilinear bounding polygon. The identification of this PLF is analogous to propagating a zero-cost function that is defined over the octilinear bounding polygon to the particle. Specifically, to identify the distance function based on the projected vectors, some embodiments use the modified wedge and channel distance rules, which were described above in Section II.D.1. One of ordinary skill will realize that other embodiments might construct other type of bounding polygon, such as a convex hull or approximate convex hull.

E. Filtering and Identifying the Minimum

The above-incorporated patent applications describe how point, line, and surface PLF's are filtered by point, line, surface filter PLF's. The Qe* search process can use similar approaches to those described in the incorporated patent applications. However, the line and surface filtering operations disclosed in the incorporated applications perform both a filter operation and a min operation (i.e., in filtering one PLF with a particle's filter PLF, they set the particle's filter PLF to the minimum of the filtered PLF and the filter PLF). For the Qe* process, combining the two operations is not optimal. For this process, the filtered PLF is first filtered by the particle's adjusted filter PLF (i.e., by a filter PLF that equals the particle's filter PLF minus epsilon). To perform such filtering, some embodiments use the filter processes similar to those described in the above-incorporated applications, with the exception that these embodiments' filter processes do not perform min operations in conjunction with their filtering operations. Once these embodiments have completed their filtering operations, they redefine a particle's filter function as the minimum of the particle current filter function and each portion of the filtered PLF that remains after the filtered PLF's filtering. To perform each minimum operation between the filter function and a remaining portion of the filtered PLF, some embodiments use filter processes similar to those described in the above-incorporated applications, except that now these processes do not perform the filter operations in conjunction with their minimum operations.

III. IDQ*

Some embodiments use an IDQ* path search to identify a lowest-cost set of paths between source and target states in a multi-layer graph with non-zero dimensional states. There can be more than one source state and more than one target states in a path search. The paths also can traverse through a set of intermediate states. In the embodiments described below, the graph is the tessellated region of an IC layout, and the source, target, and intermediate states are point, line, and surface particles in this tessellated region.

Figure 29B:
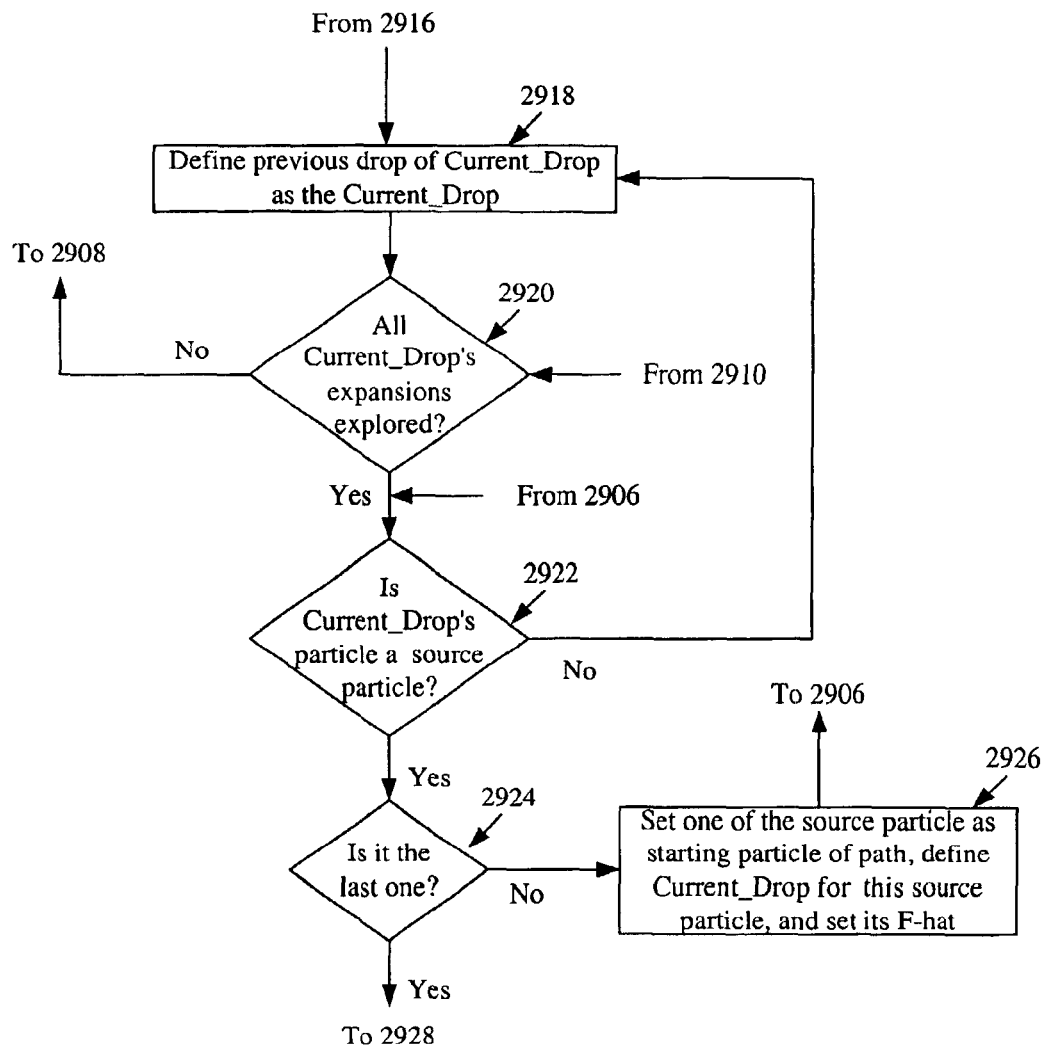
FIG. 29 illustrates an IDQ* process of some embodiments of the invention.
Figure 29C:
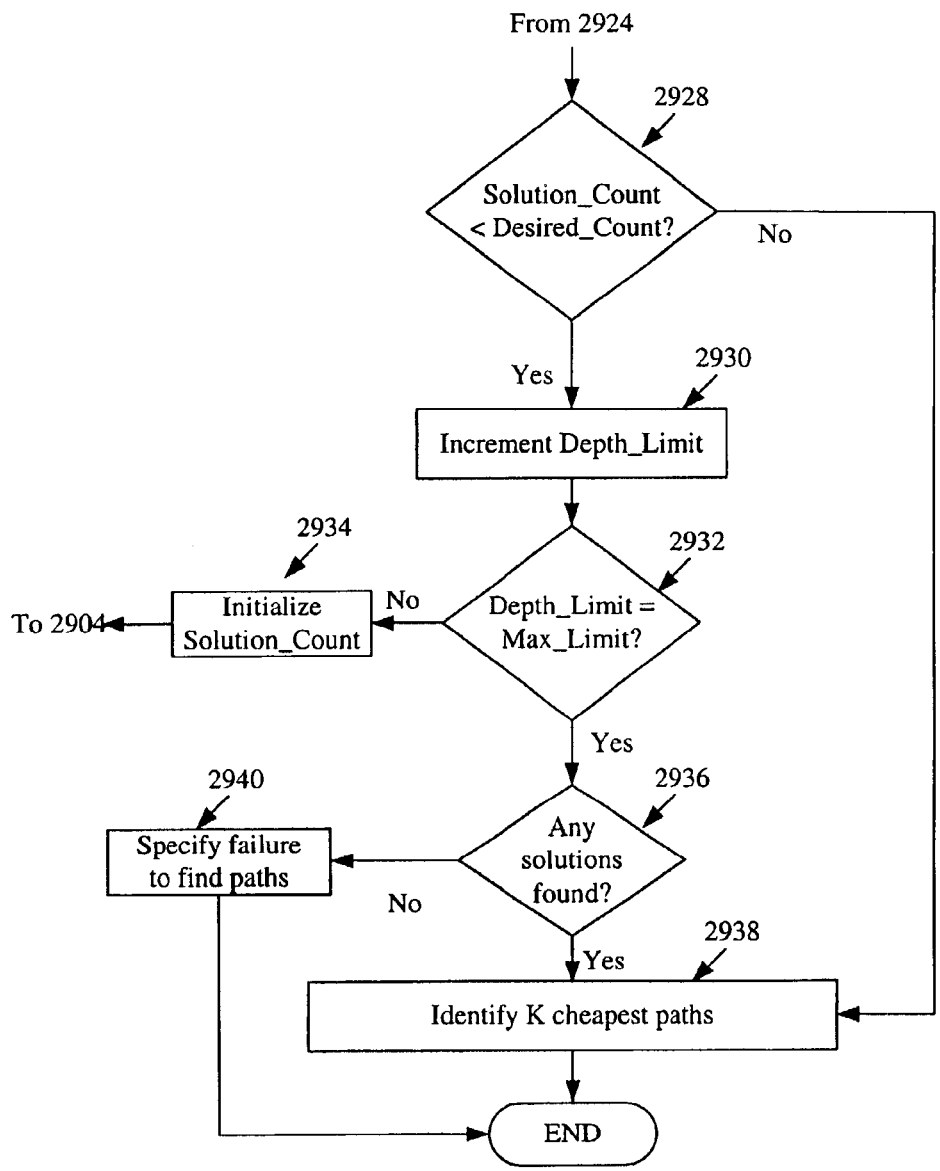

FIG. 29 illustrates an IDQ* path search process 2900. An IDQ* path search traverses through the solution space iteratively in a depth-first manner, with increasing depth limit in order to identify the lowest cost N paths. As shown in FIG. 29, the process 2900 initially defines (at 2902) an initial Depth_Limit for generating a routing path between the source and target particles. In some embodiments, the Depth_Limit is a single value. Also, different embodiments set the initial Depth_Limit differently. In some embodiments, the initial Depth_Limit is set to the minimum value of the Ĥ PLF's of all particles in the set of source particles for the path search. The identification of the Ĥ PLF of a particle was described above for the Qe* path search process. At 2902, the process also initializes a variable, Solution_Count, to be equal to 0.

Next, at 2904, the process selects one of the source particles as a starting particle of a path, and defines a drop for this particle. The process identifies this drop as the Current_Drop. Each time the process defined a drop for a source particle, it specifies the prior drop of the source-particle drop as null. At 2904, the process also computes the F̂ PLF of the Current_Drop. As mentioned above, the F̂ PLF of the Current_Drop associated with a source particle is simply its particle's Ĥ PLF, as this drop's G PLF is zero.

At 2906, the process then determines whether any expansion is possible from the Current_Drop's domain. In some embodiments, the IDQ* process 2900 identifies expansions in the same manner as the Qe* process 700 identifies them. No expansions are possible from the Current_Drop's domain if they are blocked or the process has previously explored these expansions for the Current_Drop in the current path search.

When the process determines (at 2906) that it cannot identify any expansions about the Current_Drop, the process 2900 transitions to 2922, which is further described below. Otherwise, it selects (at 2908) one of the expansions about the Current_Drop's domain, and computes the Ĥ PLF of this expansion's destination particle if necessary (i.e., if this Ĥ PLF was not previously computed).

At 2908, the process also computes the G PLF of the expansion. This computation is similar to the computation of the G PLF by the Qe* process. After computing the G PLF, the process computes the F̂ PLF of the expansion, and then filters this F̂ PLF by the Depth_Limit (i.e., discards any portion of this PLF that is larger than the Depth_Limit). The process then determines (at 2910) if any portion of the F̂ PLF remained after the filtering. If not, the process transitions to 2920, which will be described below. Otherwise, at 2912, the process creates a drop for the portion of the selected expansion's destination particle over which the F̂ PLF is defined after the filtering, and defines this remaining F̂ PLF as the drop's F̂ PLF. At 2912, the process has the newly specified drop refer to the Current_Drop as its prior drop, and then defines the newly specified drop as the Current_Drop.

After 2912, the process determines (at 2914) whether the Current_Drop's particle is a particle that belongs to the target set. If not, the process transitions back to 2906 where it determines whether there is any expansion possible from the Current_Drop's domain. If no expansion is possible from the Current_Drop's domain, the process transitions from 2906 to 2922, which is further described below. Otherwise, the process transitions to 2908, which was described above.

When the process determines (at 2914) that the Current_Drop's particle is a target particle, it has found a path between the source and target states. Hence, at 2916, it uses the back-references of the drops to perform a back trace operation that identifies the path. At 2916, it records this path and increments the Solution_Count by 1.

After 2916, the process specifies (at 2918) the prior drop of the Current_Drop as the new Current_Drop. It then determines (at 2920) whether there are any expansions about the Current_Drop's domain that it has not examined for the Current_Drop. If so, the process transitions to 2908 to select another unexamined expansion for this Current_Drop, and to perform the subsequent operations for this expansion as described above. Otherwise, the process transitions to 2922.

The process also transitions to 2922 from 2906. At 2922, the process determines whether the Current_Drop's particle is a source particle. If not, the process transitions to 2918 to define the prior drop of the Current_Drop as the new Current_Drop, and then to perform the above-described subsequent operations to determine whether there are any unexamined expansions about this drop.

When the process determines (at 2924) that the Current_Drop's particle is a source particle, it determines whether it has examined all the particles in the source set. If not, the process (at 2926) selects a previously unexamined source particle as a starting particle of a path, and defines a drop for this particle. The., process identifies this drop as the Current_Drop. At 2926, the process also computes the F̂ PLF of the Current_Drop. From 2926, the process transitions to 2906, which was described above.

When the process determines (at 2922) that the Current_Drop's particle is the last source particle (i.e., that it has examined all particles in the source set), the process determines (at 2928) whether the Solution_Count is smaller than the desired number of paths. If not, the process transitions to 2938, which is further described below. Otherwise, the process increments (at 2930) the Depth_Limit. Different embodiments increment the Depth_Limit differently at 2930. Some embodiments increment the Depth_Limit to the PLF-value of the smallest knot that they filtered in the previous attempt to find the desired number of paths (i.e., previous iteration through 2904–2926).

After incrementing the Depth_Limit, the process determines (at 2932) whether the Depth_Limit has reached a maximum limit. If not, the process resets (at 2934) the Solution_Count to zero, and then transitions to 2904 to try to identify the desired number of paths between the source and target states for the new Depth_Limit. Otherwise, the process determines (at 2936) whether it has found any path between the source and target states. If not, the process specifies (at 2940) its failure to find a path. If so, the process transitions to 2938. As mentioned above, the process can also transition to 2938 from 2930. At 2938, the process identifies the K cheapest paths that it was able to identify. It then ends.

Even though the IDQ* path search has been described above, one of ordinary skill will realize that other embodiments of the invention are other depth first searches that can propagate cost functions that are defined over dimensional states. For instance, some embodiments use an IDQe* path search that is similar to the IDQ* process 2900, except that it increments (at 2930) the Depth_Limit each time to an epsilon plus the PLF-value of the smallest knot that it filtered in the previous attempt to find the desired number of paths.

IV. THE COMPUTER SYSTEM

Figure 30:
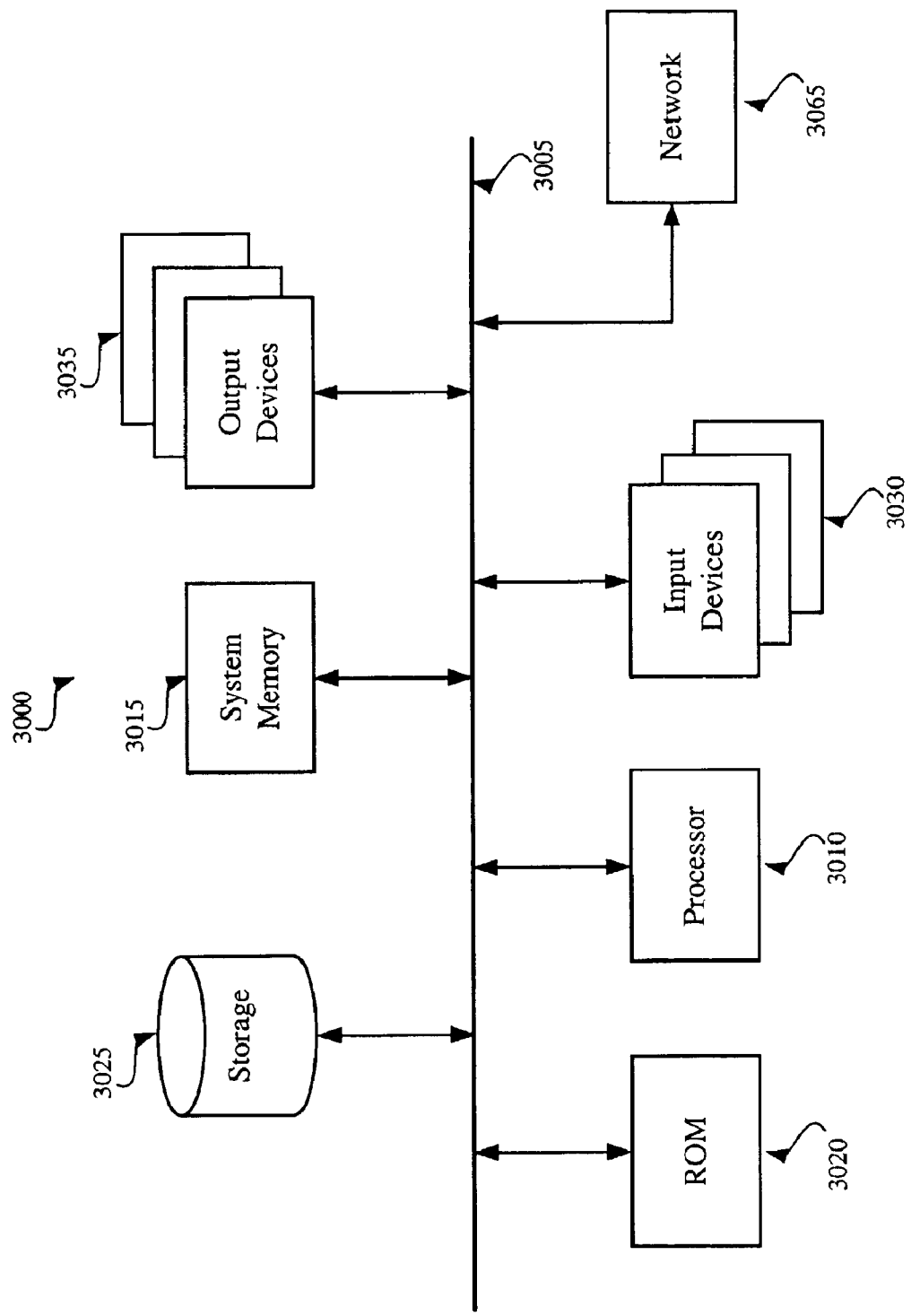
FIG. 30 illustrates a conceptual diagram of a computer system that is used in some embodiments.

FIG. 30 presents a computer system with which one embodiment of the present invention is implemented. Computer system 3000 includes a bus 3005, a processor 3010, a system memory 3015, a read-only memory 3020, a permanent storage device 3025, input devices 3030, and output devices 3035.

The bus 3005 collectively represents all system, peripheral, and chipset buses that communicatively connect the numerous internal devices of the computer system 3000. For instance, the bus 3005 communicatively connects the processor 3010 with the read-only memory 3020, the system memory 3015, and the permanent storage device 3025.

From these various memory units, the processor 3010 retrieves instructions to execute and data to process in order to execute the processes of the invention. The read-only-memory (ROM) 3020 stores static data and instructions that are needed by the processor 3010 and other modules of the computer system. The permanent storage device 3025, on the other hand, is read-and-write memory device. This device is a non-volatile memory unit that stores instruction and data even when the computer system 3000 is off. Some embodiments of the invention use a mass-storage device (such as a magnetic or optical disk and its corresponding disk drive) as the permanent storage device 3025. Other embodiments use a removable storage device (such as a floppy disk or zip® disk, and its corresponding disk drive) as the permanent storage device.

Like the permanent storage device 3025, the system memory 3015 is a read-and-write memory device. However, unlike storage device 3025, the system memory is a volatile read-and-write memory, such as a random access memory. The system memory stores some of the instructions and data that the processor needs at runtime. In some embodiments, the invention's processes are stored in the system memory 3015, the permanent storage device 3025, and/or the read-only memory 3020.

The bus 3005 also connects to the input and output devices 3030 and 3035. The input devices enable the user to communicate information and select commands to the computer system. The input devices 3030 include alphanumeric keyboards and cursor-controllers. The output devices 3035 display images generated by the computer system. For instance, these devices display IC design layouts. The output devices include printers and display devices, such as cathode ray tubes (CRT) or liquid crystal displays (LCD).

Finally, as shown in FIG. 30, bus 3005 also couples computer 3000 to a network 3065 through a network adapter (not shown). In this manner, the computer can be a part of a network of computers (such as a local area network ("LAN"), a wide area network ("WAN"), or an Intranet) or a network of networks (such as the Internet). Any or all of the components of computer system 3000 may be used in conjunction with the invention. However, one of ordinary skill in the art would appreciate that any other system configuration may also be used in conjunction with the present invention.

While the invention has been described with reference to numerous specific details, one of ordinary skill in the art will recognize that the invention can be embodied in other specific forms without departing from the spirit of the invention. For instance, the above-described embodiments propagate cost functions to one-dimensional lines and two-dimensional surfaces. Other embodiments might propagate cost functions to and from (1) a set of associated collinear points (i.e., a set of points that can be connect by a single line passing through the points) that form a one-dimensional state and/or (2) a set of associated co-planar points (i.e., a set of points that fall within a two dimensional surface) that form a two-dimensional state.

Some embodiments propagate functions to a set of associated points by examining each point independently. Specifically, for each point in the associated set, some embodiments compute a PLF-value by identifying the wedge and/or channel containing the point, and then computing the PLF-value according to the wedge and/or channel rules described above for 2415 of FIG. 24.

Some embodiments propagate functions from a set of associated points by (1) using the above-described approach of FIGS. 16–21 to identify wedge and channels vectors that emanate from the set of points, and (2) identifying the destination state's cost function based on the identified channels and wedges.

Specifically, the location of each wedge is identified by identifying the point that is the best point in the set for the wedge. Also, a channel vector might emanate from a point in the set that is on a line segment connecting two points from which two adjacent wedges emanate (i.e., from which two wedges with parallel vectors emanate). Such channel vectors can be identified based on the approach described above by reference to FIGS. 19 and 20. After identifying the wedge and channel vector emanations from the set of points, the destination state's cost function can be specified according to the approaches described above for destination points, lines, surfaces, and set of points. Thus, one of ordinary skill in the art would understand that the invention is not to be limited by the foregoing illustrative details, but rather is to be defined by the appended claims.

We claim:

1. For a multi-state space, a method of propagating a first function, which is defined over a first state, to a second state, the method comprising:

a) identifying vectors to project from at least some points on the first state that serve as locations of inflection points in the first function; wherein the vectors are identified based on a model that penalizes measurements in certain directions more than other directions;

b) based on the projected vectors, computing the second state from the first function.

2. The method of claim 1, wherein the multi-state space represents a design layout, wherein a set of interconnect line directions are available for connecting the first and second states, wherein projecting vectors comprises projecting vectors in at least some of the specified interconnect line directions.

* * * * *